(12) United States Patent
Jeon

(10) Patent No.: US 12,745,526 B2
(45) Date of Patent: Sep. 22, 2026

(54) DISPLAY DEVICE

(71) Applicant: LG Display Co., Ltd., Seoul (KR)

(72) Inventor: YoungHo Jeon, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 312 days.

(21) Appl. No.: 18/652,639

(22) Filed: May 1, 2024

(65) Prior Publication Data

US 2024/0373700 A1 Nov. 7, 2024

(30) Foreign Application Priority Data

May 2, 2023 (KR) ........................ 10-2023-0056940

(51) Int. Cl.
*H10K 59/131* (2023.01)

(52) U.S. Cl.
CPC .................................. *H10K 59/131* (2023.02)

(58) Field of Classification Search
CPC ...... H10K 59/131; H10K 59/82; H10K 59/87; H10K 2102/3023; G02F 1/1533; G02F 1/161; H05K 1/144
See application file for complete search history.

(56) References Cited

U.S. PATENT DOCUMENTS 10,877,309 B2 * 12/2020 Han .................. G02F 1/133528
2020/0235130 A1 * 7/2020 Lee ........................ H10D 86/60
2021/0141264 A1 * 5/2021 Shin .................. G02F 1/133345
2021/0351245 A1 * 11/2021 Eom .................... H10K 59/131
2022/0209183 A1 * 6/2022 Jeon ..................... H10K 59/873
2024/0373699 A1 * 11/2024 Jeon ..................... H10K 59/131
2025/0040376 A1 * 1/2025 Lee ...................... H10K 59/131

FOREIGN PATENT DOCUMENTS

EP 3819705 A1 * 5/2021 ............. H05K 1/147
EP 3231013 B1 * 3/2022 ............ H10P 74/273
EP 3224867 B1 * 4/2022 ............. H05K 1/189
KR 10-2012-0087889 A 8/2012
KR 20120087889 A * 8/2012 .......... C08F 290/067
KR 10-2021-0057854 A 5/2021

* cited by examiner

*Primary Examiner* — Mohammed Shamsuzzaman

(74) *Attorney, Agent, or Firm* — Birch, Stewart, Kolasch & Birch, LLP

(57) ABSTRACT

A display device according to an example of the present disclosure can include a display panel having a plurality of pixels, a plurality of routing lines disposed on an outer surface at one side of the display panel, a wiring substrate disposed on a lower surface of the display panel and having a plurality of connection lines respectively connected to the plurality of routing lines, and a support layer disposed between the display panel and the wiring substrate and extending toward a lower side of the plurality of connection lines, thereby reducing manufacturing costs without a design constraint which can be caused by a dead zone.

20 Claims, 14 Drawing Sheets

DISPLAY DEVICE

CROSS-REFERENCE TO RELATED APPLICATIONS

This application claims priority to Korean Patent Application No. 10-2023-0056940 filed on May 2, 2023, in the Korean Intellectual Property Office, the entire contents of which are hereby expressly incorporated by reference into the present application.

BACKGROUND

Field

The present disclosure relates to a display device with an improved configuration, which is capable of minimizing defects.

Discussion of the Related Art

Recently, with the development of various types of portable electronic devices such as mobile communication terminals and notebook computers, there is an increasing demand for display devices applicable to the portable electronic devices.

Studies are being conducted on liquid crystal display devices, field emission display devices, organic light-emitting display devices, inorganic light-emitting display devices, or the like as the display devices. In particular, among these display devices, electroluminescent display devices including the organic light-emitting display devices and the inorganic light-emitting display devices are expanding in application fields by virtue of the development of mass-production technologies, ease of drive means, low power consumption, high image quality, large screen implementation, and flexibility.

The electroluminescent display device has a plurality of pixels provided in a matrix, and each of the plurality of pixels includes three or more subpixels. One or more thin-film transistors (TFTs) are provided in each subpixel to individually control the subpixels.

SUMMARY OF THE DISCLOSURE

An object to be achieved by the embodiment of the present disclosure is to provide a transparent display device provided in the form of an island without forming a dead zone.

Another object to be achieved by the embodiment of the present disclosure is to provide a display device capable of removing an air gap between a display panel and a wiring substrate.

Still another object to be achieved by the embodiment of the present disclosure is to provide a display device capable of suppressing a defect in which an edge of the display panel is not filled with a bonding agent.

Another object of the present disclosure is to provide a display device which can address the limitations and disadvantages associated with the related art.

Objects of the present disclosure are not limited to the above-mentioned objects, and other objects, which are not mentioned above, can be clearly understood by those skilled in the art from the following descriptions.

A display device according to an embodiment of the present disclosure can include a display panel having a plurality of pixels, a plurality of routing lines disposed on an outer surface at one side of the display panel, a wiring substrate disposed on a lower surface of the display panel and having a plurality of connection lines respectively connected to the plurality of routing lines and a support layer disposed between the display panel and the wiring substrate and extending toward a lower side of the plurality of connection lines.

Other detailed matters of the exemplary embodiments are included in the detailed description and the drawings.

According to the embodiment of the present disclosure, the wiring substrate and the source printed circuit board, to which signals are inputted, are separately configured, and the signal is applied to the display panel through the line on the wiring substrate, such that it is possible to manufacture the transparent display device in the form of an island without forming a dead zone. Therefore, it is possible to provide the effect of suppressing the design constraint which can be caused by a dead zone and reducing manufacturing costs.

One or more embodiments of the present disclosure provide the effect of suppressing a stain defect by removing an air gap between the transparent panel and the wiring substrate.

One or more embodiments of the present disclosure provide the effect of suppressing a non-filling defect of the bonding agent by applying the chamfer structure to the edge area of the bonding layer.

The effects of the present disclosure are not limited to the aforementioned effects, and other effects, which are not mentioned above, will be apparently understood to a person having ordinary skill in the art from the following description.

The objects to be achieved by the present disclosure, the means for achieving the objects, and the effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
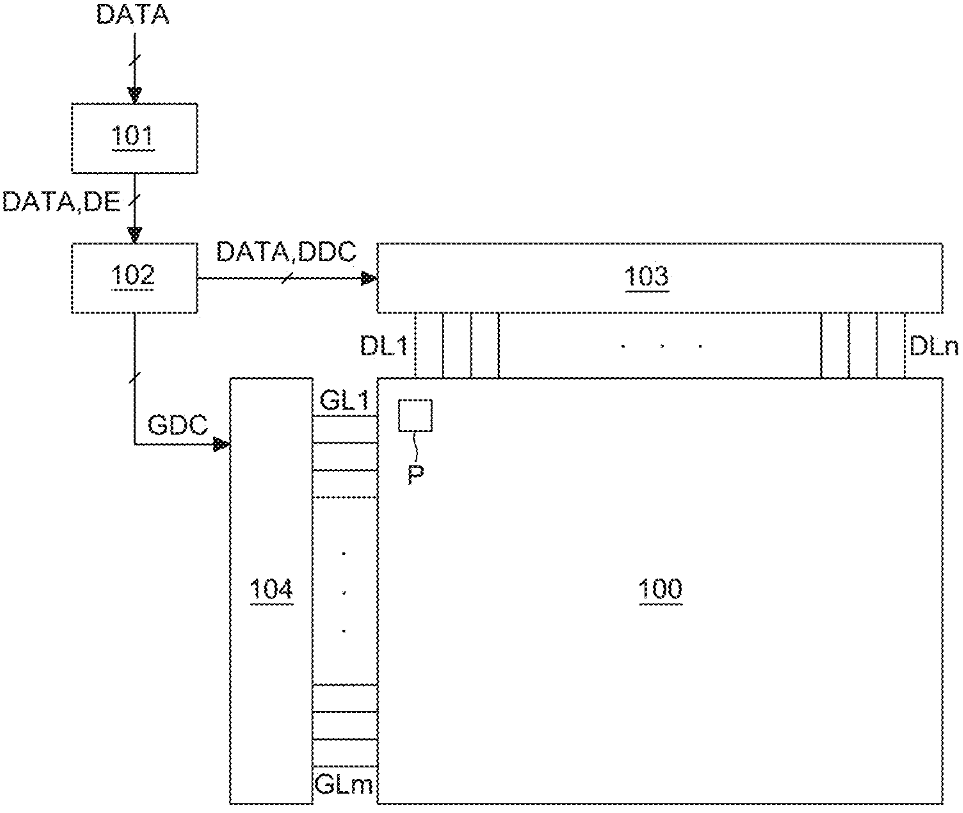
FIG. 1 is a block diagram of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the disclosure. Further, in the following description of the present disclosure, a detailed explanation of known related technologies can be omitted or may be provided briefly to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

In construing an element, the element is construed as including an error range although there is no explicit description.

In describing a position relationship, for example, when a position relation between two parts is described as "on," "over," "under," and "next" one or more other parts can be disposed between the two parts unless "just(ly)" or -"direct (ly)" is used.

In describing a time relationship, for example, when the temporal order is described as 'after', 'subsequent', 'next', and 'before', a case which is not continuous can be included unless "just(ly)" or "direct(ly)" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., can be used. Such terms are used for merely discriminating the corresponding elements from other elements and the corresponding elements are not limited in their essence, sequence, precedence, or number by the terms. It will be understood that when an element is referred to as being "coupled" or "connected to" another element, it can be directly coupled or directly connected to the other element, or intervening other elements can be present therebetween.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

In the present disclosure, examples of a display device can include a narrow-sense display device such as a quantum dot module, an organic light emitting diode (OLED) module or a liquid crystal module (LCM) having a display panel and a driver for driving the display panel. Further, examples of the display device can include a set device (or a set apparatus) or a set electronic apparatus such as a notebook computer, a TV, a computer monitor, an equipment apparatus including an automotive apparatus or another type of apparatus for vehicles, or a mobile electronic device such as a smartphone or an electronic pad, which is a complete product (or a final product) including an LCM, an OLED module, and a quantum dot (QD) module.

Therefore, in the present disclosure, examples of the display device can include a narrow-sense display device itself, such as an LCM, an OLED module, and a QD module, and a set device, which is a final consumer device or an application product including the LCM, the OLED module, and the QD module.

In some embodiments, an LCM, an OLED module, and a QD module including a display panel and a driver can be referred to as a narrow-sense display device, and an electronic device, which is a final product including an LCM, an OLED module, and a QD module can be referred to as a set device. For example, the narrow-sense display device can include a display panel, such an LCM, an OLED module, or a QD module, and a source printed circuit board (PCB), which is a controller for driving the display panel. The set device can further include a set PCB, which is a set controller electrically connected to the source PCB to overall control the set device.

A display panel applied to embodiments of the present disclosure can use any type of display panel, including a liquid crystal display panel, an organic light emitting diode (OLED) display panel, a quantum dot (QD) display panel, and an electroluminescent display panel. The display panel of the embodiment is not limited to a specific display panel capable of bezel bending with a flexible substrate for an organic light emitting diode (OLED) display panel and a lower back plate support structure. Further, a shape or a size of a display panel applied to a display device according to these embodiments is not limited.

In an example where the display panel is the organic light emitting display panel, the display panel can include a plurality of gate lines, data lines, and pixels respectively provided in intersections of the gate lines and the data lines. Further, the display panel can include an array including a thin film transistor (TFT), which is an element for selectively applying a voltage to each of the pixels, a light emitting element layer on the array, and an encapsulation substrate or an encapsulation layer disposed on the array to cover the light emitting element layer. The encapsulation substrate can protect the TFT and the light emitting element layer from an external impact and can prevent water or oxygen from penetrating into the light emitting element layer. Further, a layer provided on the array can include an inorganic light emitting layer, for example, a nano-sized material layer, a quantum dot, or the like.

Features of various embodiments of the present disclosure can be partially or overall coupled to or combined with each other, and can be variously inter-operated with each other and driven technically. Embodiments of the present disclosure can be carried out independently from each other, or can be carried out together in co-dependent relationship.

Hereinafter, various embodiments of the present disclosure will be described as below through the accompanying drawings. Here, all components of each display device according to all embodiments of the present disclosure are operatively coupled and configured. The scale of components illustrated in the drawing is not limited to the scale illustrated in the drawing because the scale has a different than an actual scale for the convenience of explanation.

FIG. 1 is a block diagram of a display device according to an embodiment of the present disclosure.

With reference to FIG. 1, for example, the display device according to the embodiment of the present disclosure can include an image processor 101, a timing controller 102, a data driver 103, a gate driver 104, and a display panel 100.

For example, the image processor 101 can output a data signal DATA, a data enable signal DE, and the like supplied from the outside. In addition, the image processor 101 can output one or more of a vertical synchronizing signal, a horizontal synchronizing signal, and a clock signal in addition to the data enable signal DE.

The timing controller 102 can receive the data signal DATA in addition to the data enable signal DE or the driving signals including the vertical synchronizing signal, the horizontal synchronizing signal, and the clock signal from the image processor 101. Based on the driving signal, the timing controller 102 can output a gate timing control signal GDC for controlling an operation timing of the gate driver 104 and output a data timing control signal DDC for controlling an operation timing of the data driver 103.

In addition, in response to the data timing control signal DDC supplied from the timing controller 102, the data driver 103 can sample and latch the data signal DATA supplied from the timing controller 102, convert the data signal DATA into a gamma reference voltage, and output the gamma reference voltage.

For example, the data driver 103 can output the data signal DATA through a data line DL1-DLn where n is a real number such as an integer greater than 1.

In addition, the gate driver 104 can output the gate signal while shifting a level of the gate voltage in response to the gate timing control signal GDC supplied from the timing controller 102.

For example, the gate driver 104 can output the gate signal through a gate line GL1-GLm where m is a real number such as an integer greater than 1.

The display panel 100 can display an image as subpixels P emit light in response to the data signal DATA and the gate signal supplied from the data driver 103 and the gate driver 104. A detailed structure of the subpixel P will be described in detail with reference to FIGS. 2 and 9 to 11.

Figure 2:
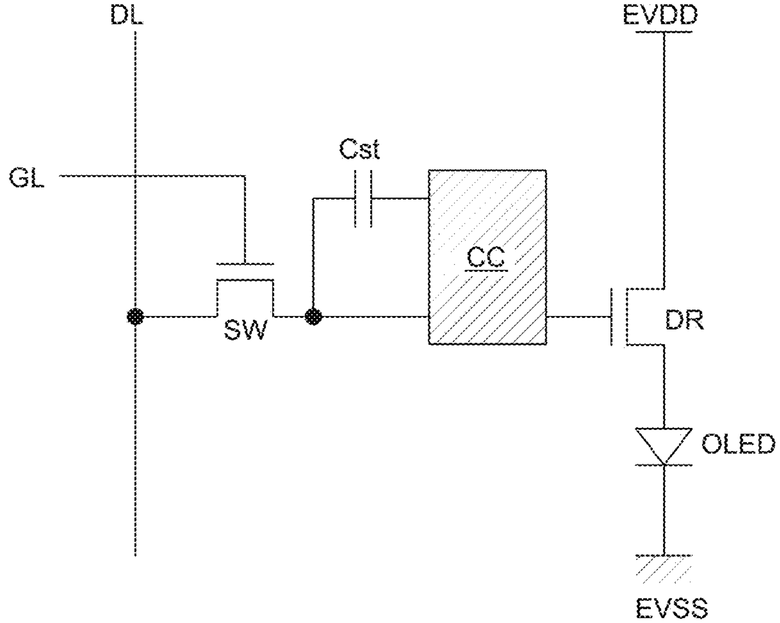
FIG. 2 is a circuit diagram of a subpixel of the display device in FIG. 1.

FIG. 2 is a circuit diagram of an example of a subpixel of the display device in FIG. 1. Here, each subpixel of the display device can have the configuration shown in FIG. 2 or other variations.

With reference to FIG. 2, for example, one subpixel of the display device of the embodiment of the present disclosure can include a switching transistor SW, a driving transistor DR, a compensating circuit CC, and a light-emitting element OLED (or organic light emitting diode).

The light-emitting element OLED can operate to emit light based on a drive current produced by the driving transistor DR.

The switching transistor SW can perform a switching operation so that the data signal supplied through a data line DL is stored, as a data voltage, in a capacitor Cst in response to the gate signal supplied through a gate line GL.

The driving transistor DR can operate such that a predetermined drive current flows between a high-potential power line EVDD and a low-potential power line EVSS while corresponding to the data voltage stored in the capacitor Cst.

The compensating circuit CC is a circuit for compensating for a threshold voltage or the like of the driving transistor DR. The compensating circuit CC can include one or more thin-film transistors and one or more capacitors. The compensating circuit CC can have very various configurations depending on a compensation method.

The subpixel illustrated in FIG. 2 has a 2T (Transistor)1C (Capacitor) structure including the switching transistor SW, the driving transistor DR, the capacitor Cst, and the light-emitting element OLED. However, in case that the compensating circuit CC is added, the subpixel can have various configurations such as 3T1C, 4T2C, 5T2C, 6T1C, 6T2C, 7T1C, 7T2C, or the like. However, the embodiment of the present disclosure is not limited thereto.

Figure 3:
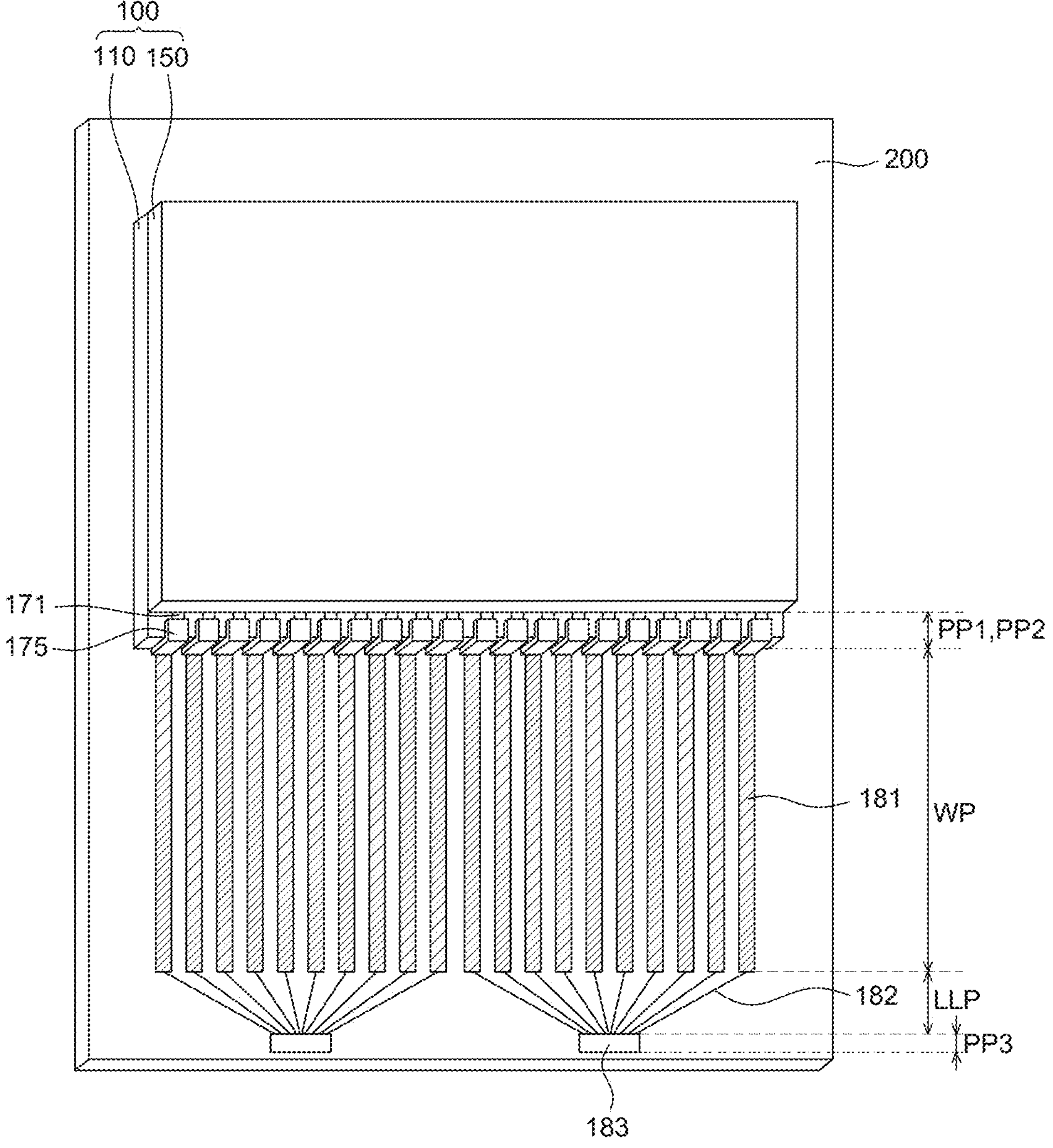
FIG. 3 is a perspective view illustrating the display device according to the embodiment of the present disclosure.

FIG. 3 is a perspective view illustrating the display device according to the embodiment of the present disclosure.

Figure 4:
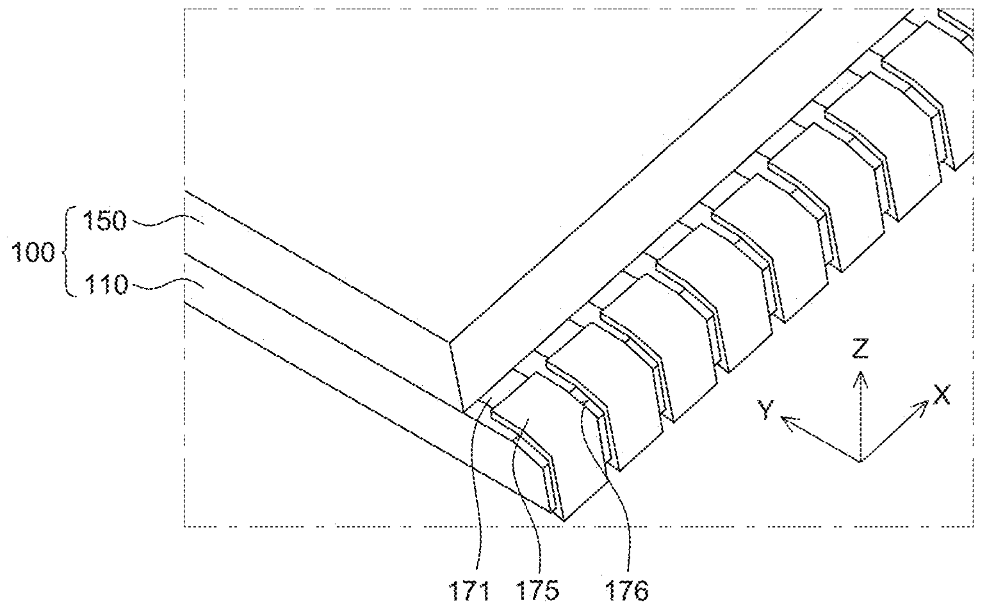
FIG. 4 is an enlarged view of a part of the display device in FIG. 3.

FIG. 4 is an enlarged view of a part of the display device in FIG. 3.

Figure 5:
FIG. 5 is a top plan view illustrating a wiring substrate of the display device in FIG. 3.
Figure 5:
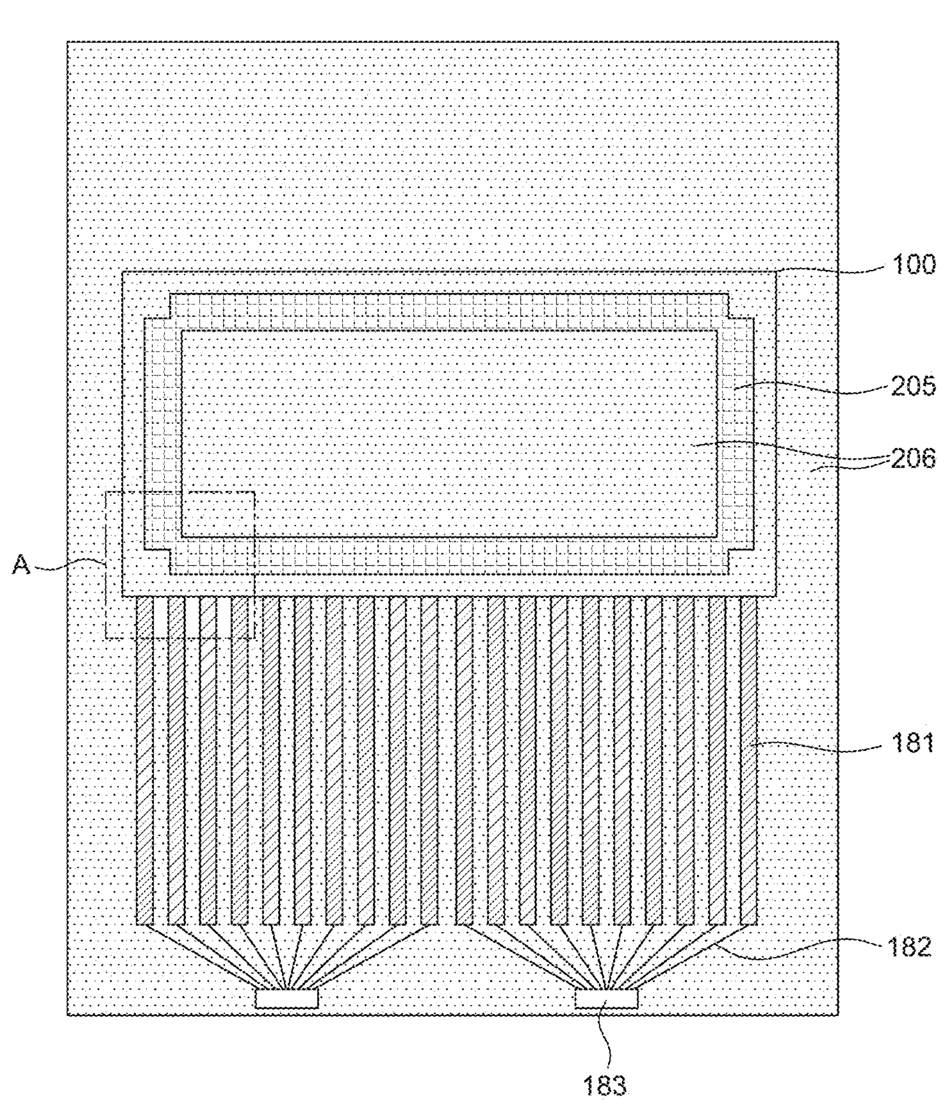

FIG. 5 is a top plan view illustrating a wiring substrate of the display device in FIG. 3.

Figure 6:
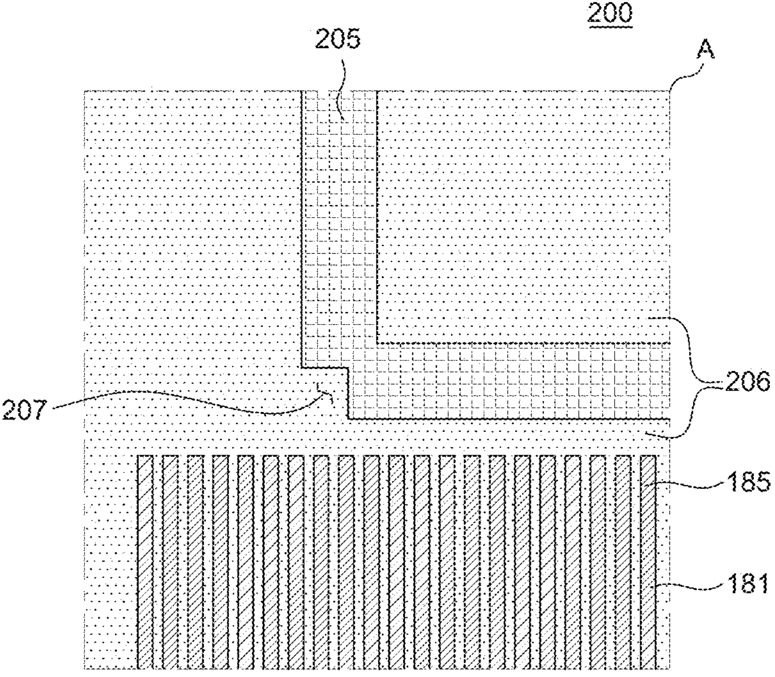
FIG. 6 is an enlarged view of part A in FIG. 5.

FIG. 6 is an enlarged view of part A in FIG. 5.

Figure 7:
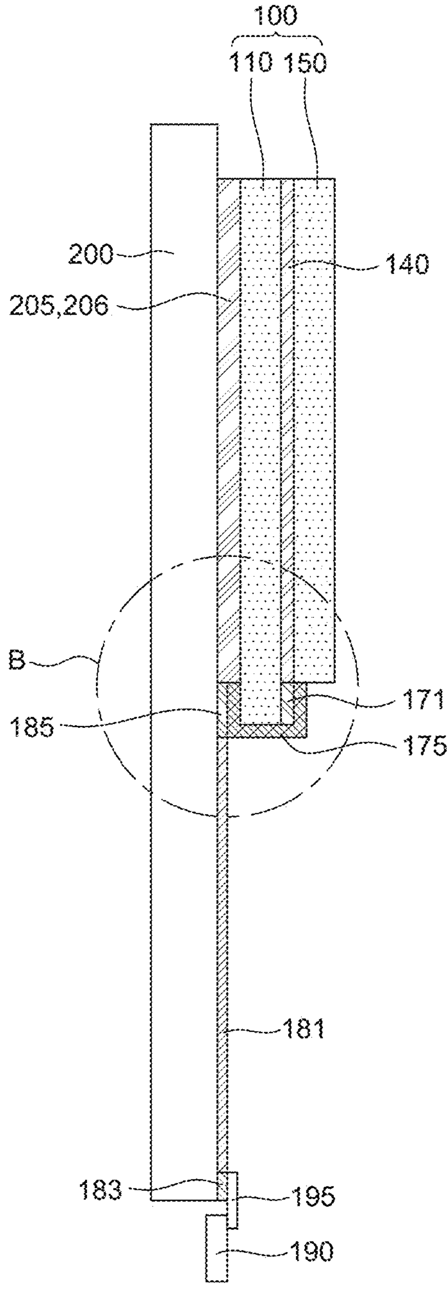
FIG. 7 is a view illustrating a cross-section of the display device in FIG. 3.

FIG. 7 is a view illustrating a cross-section of the display device in FIG. 3.

Figure 8:
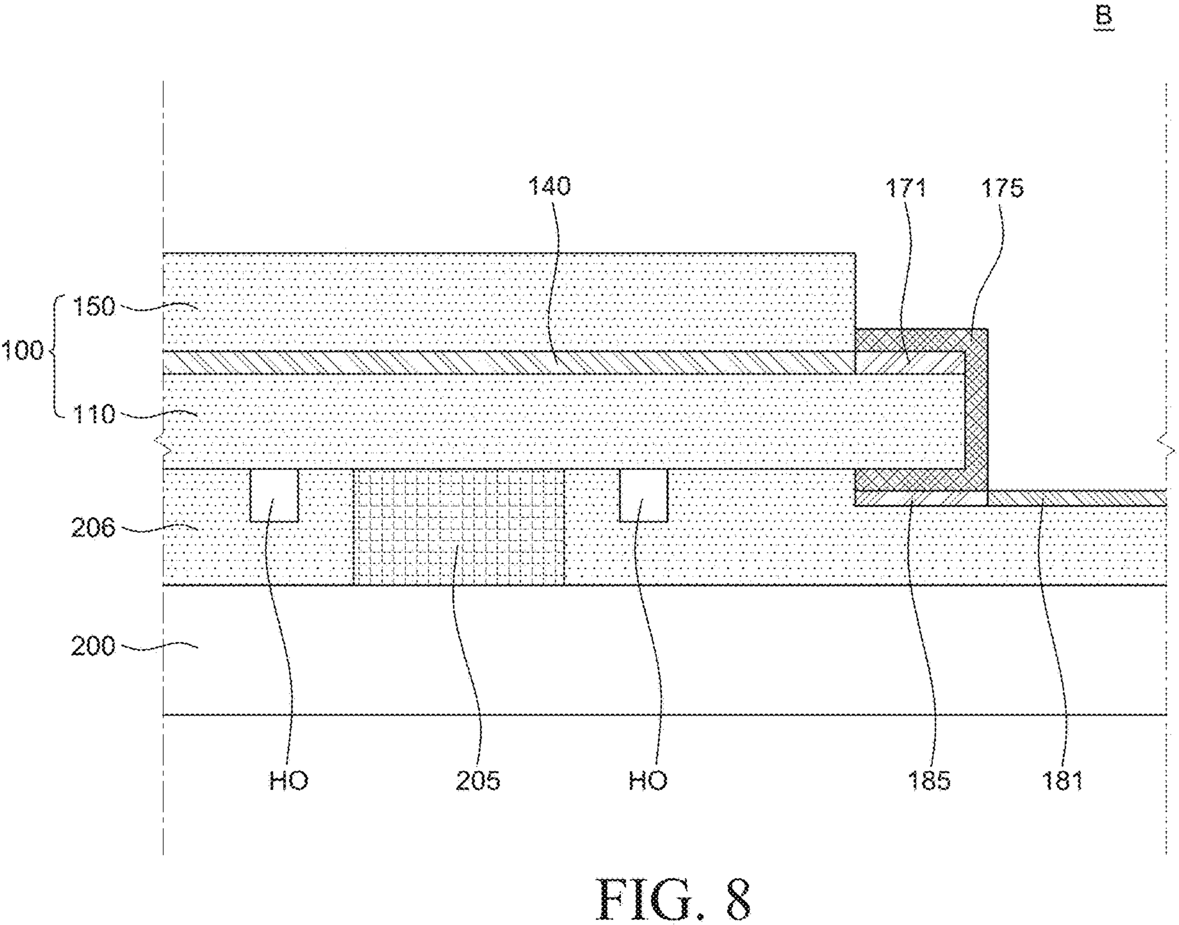
FIG. 8 is an enlarged view of part B in FIG. 7.

FIG. 8 is an enlarged view of part B in FIG. 7.

Particularly, FIG. 4 illustrates an enlarged part of the display panel 100, and FIG. 5 illustrates a wiring substrate 200 to which the display panel 100 is attached. In addition, FIG. 7 illustrates a cross-section taken along one connection line 181 of the display device in FIG. 3.

With reference to FIGS. 3 to 8, the display device according to the embodiment of the present disclosure can include the display panel 100 and the wiring substrate 200 disposed on a rear surface of the display panel 100.

The display panel 100 is a panel configured to display images to a user.

The display panel 100 can include a display element configured to display images, a driving element configured to operate the display element, and lines configured to transmit various types of signals to the display element and the driving element. Different display elements can be defined depending on the types of display panels 100. For example, in a case in which the display panel 100 is an organic light-emitting display panel, the display element can be an organic light-emitting element including an anode, an organic layer, and a cathode. In another example, the display element can be a micro LED. For example, the micro LED can be formed by stacking a non-doped GaN buffer layer, which is formed on a front surface of a substrate, an n-type GaN layer, an active layer, which has a multi-quantum well (MQW) structure, and a p-type GaN layer. Micro LEDs can be formed to correspond to respective micro LED areas. The micro LEDs can each operate as a light-emitting element that can emit light by itself. For example, a micro LED, which emits blue light, can be used. However, the present disclosure is not limited thereto. The micro LEDs, which respectively emit red light, green light, and blue light, can be used. For example, the micro LED can be formed by forming a buffer layer on the substrate and growing a GaN thin-film on the buffer layer. In this case, for example, sapphire, silicon (Si), GaN, silicon carbide (SiC), gallium arsenic (GaAs), zinc oxide (ZnO), or the like can be used for the substrate for growing the GaN thin-film. However, the present disclosure is not limited thereto. In addition, for example, the micro LED can be formed by crystallizing an inorganic material, such as GaN, on a semiconductor substrate. This crystallization process can be called epitaxy, epitaxial growth, or an epitaxial process.

Hereinafter, the assumption is made that the display panel 100 is the organic light-emitting display panel. However, the display panel 100 is not limited to the organic light-emitting display panel.

The display panel 100 can include a display area and a non-display area. The display area is an area of the display panel 100 in which images are displayed.

The display area can include a plurality of subpixels configured to constitute a plurality of pixels, and a circuit configured to operate the plurality of subpixels. The plurality of subpixels is minimum units that constitute the display area. The display element can be disposed in each of the plurality of subpixels. The plurality of subpixels can constitute the pixel. For example, the plurality of subpixels can each include the light-emitting element including the anode, the organic layer, and the cathode. However, the present disclosure is not limited thereto. In addition, the circuit configured to operate the plurality of subpixels can include driving elements, lines, and the like. For example, the circuit can include a thin-film transistor, a storage capacitor, a gate line, a data line, and the like. However, the present disclosure is not limited thereto.

The non-display area is an area in which no image is displayed.

For example, various lines and circuits for operating the organic light-emitting element in the display area can be disposed in the non-display area. For example, the non-display area can include link lines for transmitting signals to the plurality of subpixels and the circuit in the display area. The non-display area can include a drive integrated circuit (IC). However, the present disclosure is not limited thereto.

The left and right sides in FIG. 3 can be defined as gate pad parts on which the gate driver IC is disposed. The lower side in FIG. 3 can be defined as a data pad part connected to a flexible film 195 through a connection line 181. However, the present disclosure is not limited thereto. For example, the gate pad part can also be included in the data pad part at the lower side.

In this case, the gate driver IC can be formed independently of the display panel 100 and electrically connected to the display panel 100 in various ways. However, the gate driver IC can be configured in a gate-in-panel (GIP) manner so as to be mounted in the display panel 100. In this case, the non-display area can include a GIP area in which a GIP circuit is disposed. For example, the GIP area can be positioned in the non-display area at the left and right sides of the display panel 100.

The display panel 100 can include various additional elements configured to generate various signals or operate the pixel in the display area. The additional elements for operating the pixel can include an inverter circuit, a multiplexer, an electrostatic discharge (ESD) circuit, and the like. The display panel 100 can also include additional elements related to functions other than the function of operating the pixel. For example, the display panel 100 can include additional elements that provide a touch detection function, a user certification function (e.g., fingerprint recognition), a multi-level pressure detection function, a tactile feedback function, and the like. The additional elements can be positioned in the non-display area NA and/or an external circuit connected to a connection interface.

The flexible film 195 can be a film for supplying signals to the plurality of subpixels and the circuit in the display area. The flexible film 195 can be electrically connected to the wiring substrate 200. The flexible film 195 can be disposed at one end of the wiring substrate 200 and supply power voltages, data voltages, and the like to the plurality of subpixels and the circuit in the display area through the plurality of connection lines 181. For example, the drive IC such as the data driver IC can be disposed on the flexible film 195.

The connection line 181 can be made of a metallic material having low resistance, low reflectivity, and a high transmittance rate.

The flexible film 195 can be a tape carrier package (TCP) or a chip-on film (COF). In this case, for example, one side edge portion (or an output bonding portion) of the flexible film 195 can be attached to a plurality of third pads (or input pads) 183 disposed on the wiring substrate 200 by a film attaching process using an anisotropic conductive film. In addition, the other side edge portion (or an input bonding portion) of the flexible film 195 can be attached to a printed circuit board 190 by a film attaching process using an anisotropic conductive film.

The printed circuit board 190 can be disposed at one end of the flexible film 195 and connected to the flexible film 195. The printed circuit board 190 is a component for supplying a signal to the drive IC. For example, the printed circuit board 190 can supply various signals, such as driving signals and data signals, to the drive IC.

Meanwhile, the display panel 100 according to the embodiment of the present disclosure can include a first substrate 110, a second substrate 150, an element part 140, and a routing line 175.

The first substrate 110 can be expressed as a display substrate, a pixel array substrate, a lower substrate, or a base substrate. The first substrate 110 can be made of glass or plastic. The first substrate 110 can be a glass substrate or a thin glass substrate or plastic substrate that can be bent or curved. For example, the first substrate 110 can be a glass substrate or reinforced glass. For example, the reinforced glass can include any one of sapphire glass and gorilla glass or laminated glass thereof.

The display panel 100 can include pixel driving lines and a plurality of pixels disposed on the first substrate 110.

The pixel driving lines can be provided on a first surface of the first substrate 110 and supply signals required to operate the plurality of pixels (or emit light). For example, the pixel driving lines can include a data line, a gate line, a pixel driving power line (or first power line), and a pixel common power line (or second power line). Additionally, the pixel driving lines can further include a reference power line (or sensing line) in accordance with a driving operation (or operation) of a pixel circuit disposed in a circuit area of the pixel.

The pixel driving lines are each electrically connected to a first pad part PP1 disposed on a first edge portion (or lower side) of the first surface (or top surface) of the first substrate 110.

The first pad part PP1 can include a plurality of first pads 171 disposed in parallel with each other in a first direction (e.g., X direction) on an upper portion of an insulation layer exposed to the first edge portion of the first surface of the first substrate 110.

For example, the plurality of first pads 171 can be divided (classified) into a plurality of first data pads, a plurality of first pixel driving power pads, and a plurality of first pixel common power pads. Therefore, the first pad part PP1 can include a first data pad part having the plurality of first data pads connected to a plurality of data lines, a first pixel driving power pad part having the plurality of first pixel driving power pads connected to a plurality of pixel driving power lines, and a first pixel common power pad part having the plurality of first pixel common power pads connected to a plurality of pixels common power lines. Selectively, the first pad part PP1 can further include a first reference power pad part having a plurality of first reference power pads connected to a plurality of reference power lines.

The plurality of pixels can be respectively disposed in a plurality of pixels areas arranged at first intervals (or first pitches) in the first direction (X direction) and a second direction (e.g., Y direction). The plurality of pixels can include a spontaneous light-emitting element (or spontaneous light element) configured to emit light toward an upper side of the first surface of the first substrate 110 by emitting light in a top emission manner in response to signals supplied from the adjacent corresponding pixel driving lines, and a pixel circuit connected to the adjacent pixel driving lines and allow the spontaneous light-emitting element to emit light. For example, the pixel circuit can include a thin-film driving transistor configured to supply a data current, which corresponds to a data signal supplied through the data line, to the spontaneous light-emitting element.

Meanwhile, the first substrate 110 can further include a chamfer 176 formed on an edge portion between the first surface and an outer surface thereof. The chamfer 176 can serve to both minimize or reduce damage to the edge portion of the first substrate 110 caused by a physical impact from the outside and suppress the disconnection of the routing line 175 along the edge portion of the first substrate 110. For example, the chamfer 176 can have an angle of 45 degrees. However, the present disclosure is not necessarily limited thereto. The chamfer 176 can be implemented by a chamfering process using a cutting wheel or a grinding wheel. Therefore, outer surfaces of the first pads 171 of the first pad part PP1, which are disposed to adjoin the chamfer 176, can include inclined surfaces inclined at an angle corresponding to the angle of the chamfer 176 by being removed or ground together with the edge portion of the first substrate 110 by the chamfering process.

Meanwhile, the first substrate 110 can further include a gate drive circuit (or gate driver IC) disposed in the display area.

The gate drive circuit can be disposed in the display area to supply scan signals (or gate signals) to the pixels disposed on the first substrate 110. The gate drive circuit can simultaneously supply the scan signals to the pixels disposed on a horizontal line parallel to the first direction (X direction). For example, the gate drive circuit can supply at least one scan signal to the pixels disposed on one horizontal line through at least one gate line.

In addition, for example, the gate drive circuit can be implemented as a shift register including a plurality of stage circuit parts. For example, the display device according to the present disclosure can include the shift register disposed in the display area on the first substrate 110 and configured to supply the scan signal to the pixels.

The plurality of stage circuit parts can each include a plurality of branch circuits disposed to be spaced apart from one another on the horizontal line of the first substrate 110 in the first direction (X direction). For example, the plurality of branch circuits can each include at least one thin-film transistor (or branch thin-film transistor) and be disposed one by one in at least one pixel (or pixel area) within the horizontal line in the first direction (X direction). The plurality of stage circuits can generate the scan signal and supply the scan signal to the corresponding gate line in the designated order in response to a gate control signal supplied through the first pad part PP1. For example, the gate control signal can include a start signal, a plurality of shift clocks, at least one gate driving power, and at least one gate common power.

For example, the first substrate 110 can further include a group of gate control lines scattered and disposed between the plurality of pixels and connected to the gate drive circuit. The group of the gate control lines can be respectively and selectively connected to the plurality of branch circuits respectively disposed in the plurality of stage circuits parts. For example, the group of the gate control lines can include a start signal line, a plurality of shift clock lines, at least one gate driving power line, and at least one gate common power line. For example, the plurality of shift clock lines can be divided (or classified) into a plurality of scan clock lines and a plurality of carry clock lines. In this case, the plurality of carry clock lines can be excluded.

In addition, the first pad part PP1 can further include a first gate pad part having a plurality of first gate pads connected to the group of the gate control lines. For example, the plurality of first gate pads can be divided (or classified) into a first start signal pad connected to the start signal line, a plurality of first shift clock pads respectively connected to the plurality of shift clock lines, at least one first gate driving power pad connected to at least one gate driving power line, and at least one first gate common power pad connected to at least one gate common power line. Therefore, the first gate pad part can include the first start signal pad, the plurality of first shift clock pads, at least one first gate driving power pad, and at least one first gate common power pad. For example, the plurality of first shift clock pads can be divided (or classified) into a plurality of first scan clock pads respectively connected to the plurality of scan clock lines, and a plurality of first carry clock pads respectively connected to the plurality of carry clock lines. In this case, the plurality of first carry clock pads can be excluded.

The second substrate 150 can be expressed as an encapsulation substrate, an upper substrate, or a cover glass.

The second substrate 150 can be made of glass or plastic. The second substrate 150 can be a glass substrate or a thin glass substrate or plastic substrate that can be bent or curved. For example, the second substrate 150 can be a glass substrate or reinforced glass. For example, the second substrate 150 can be made of the same material as the first substrate 110. For example, a size of the second substrate 150 can be smaller than a size of the first substrate 110, such that the first substrate 110 can be exposed, and the first pad part PP1 can be positioned on the first surface of the exposed first substrate 110.

The second substrate 150 can be coupled (or attached) to the first surface of the first substrate 110 by means of the element part 140. The second substrate 150 can include a rear surface (or back surface) directed toward the first surface of the first substrate 110 or coupled to the element part 140, a front surface (or forward surface) opposite to the rear surface, and an outer surface between the front surface and the rear surface.

The element part 140 can be interposed between the first substrate 110 and the second substrate 150. For example, the element part 140 can include a TFT element layer including a thin-film transistor, a light-emitting element layer including a light-emitting element, and an encapsulation layer including a bonding film. However, the present disclosure is not limited thereto. The first substrate 110 and the second substrate 150 can be attached to each other while being opposite to each other by means of the element part 140. For example, the first surface of the first substrate 110 can be coupled to one surface of the element part 140, and the rear surface of the second substrate 150 can be coupled to the other surface of the element part 140. Therefore, the first substrate 110 and the second substrate 150, which are attached (or coupled) to each other by means of the element part 140, can constitute the display panel 100.

The wiring substrate 200 can be disposed on the rear surface of the display panel 100 by means of bonding members 205 and 206. The wiring substrate 200 can be made of glass or plastic. The wiring substrate 200 can be a glass substrate or a thin glass substrate or plastic substrate that can be bent or curved. For example, the wiring substrate 200 can be a glass substrate or reinforced glass. For example, the wiring substrate 200 can be made of the same material as the first substrate 110. For example, a size of the wiring substrate 200 can be larger than a size of the display panel 100. The wiring substrate 200 can serve to transmit signals to the pixel driving lines and increase rigidity of the display panel 100.

The bonding members 205 and 206 can be interposed between the display panel 100 and the wiring substrate 200.

For example, the bonding members 205 and 206 can include a bonding layer 205 disposed between the display panel 100 and the wiring substrate 200 and configured to attach the display panel 100 and the wiring substrate 200. For example, the second surface (or rear surface) of the first substrate 110 of the display panel 100 can be coupled to one surface of the bonding layer 205, and an upper surface of the wiring substrate 200 can be coupled to the other surface of the bonding layer 205. Therefore, the display panel 100 and the wiring substrate 200, which are attached (or coupled) to each other by means of the bonding layer 205, can constitute the transparent display device in the form of an island. For example, the bonding layer 205 can have a rim shape (or border shape) inside an edge of the display panel 100. However, the present disclosure is not limited thereto. For example, the bonding layer 205 can have a rectangular rim shape and have a chamfer 207 in the edge area. However, the present disclosure is not limited thereto. The chamfer 207 can serve to suppress a non-filling defect of a bonding agent in the edge area of the bonding layer 205. For example, even though the bonding agent is applied in a round shape in the edge area when the bonding layer 205 is formed by applying the bonding agent, the chamfer 207 formed in the edge area can suppress a non-filling defect of the bonding agent. Therefore, it is possible to suppress a disconnection defect from the wiring substrate 200 caused by a non-filling defect on a second pad part PP2 at an end of the display panel 100. The bonding layer 205 can be made of an optically transparent bonding agent, for example, optically clear resin (OCR). However, the present disclosure is not limited thereto.

The bonding members 205 and 206 can further include support layers 206 disposed between the display panel 100 and the wiring substrate 200 and configured to maintain a predetermined gap between the display panel 100 and the wiring substrate 200. For example, the support layers 206 can be disposed inside and outside the bonding layer 205. For example, the support layers 206 can be disposed on the entire surface of the wiring substrate 200 inside the bonding layer 205 and outside the bonding layer 205. For example, the support layer 206 can be configured as an organic insulation layer made of photo-acryl (PAC). However, the present disclosure is not limited thereto.

In the embodiment of the present disclosure, the bonding members 205 and 206 including the transparent support layer 206 and the bonding layer 205 can be provided between the display panel 100 and the wiring substrate 200 to maintain the gap without an air gap between the display panel 100 and the wiring substrate 200, thereby suppressing a problem with visibility by suppressing a stain defect caused by an air gap. If an air gap exists between the display panel 100 and the wiring substrate 200 after the display panel 100 and the wiring substrate 200 are attached, a stain defect can occur. The stain defect can degrade transparency when the display device does not operate. Meanwhile, for example, the support layer 206 is cured after the display panel 100 and the wiring substrate 200 are attached. Therefore, it is possible to compensate for a level difference caused by the routing line 175 and a plurality of second pads 185 disposed on the second pad part PP2. However, the present disclosure is not limited thereto. In consideration of the level difference of the plurality of second pads 185 and the routing line 175, a thickness of the support layer 206 of the second pad part PP2 can be smaller (less) than a thickness of the support layer 206 of the rear surface of the display panel 100.

The bonding layer 205 and the support layer 206, which are applied to the embodiment of the present disclosure, can have a transparency of 90% or more.

Meanwhile, in the embodiment of the present disclosure, an anti-overflow groove HO can be provided in an upper surface of the support layer 206, which is adjacent to the bonding layer 205, and disposed along the bonding layer 205. However, the present disclosure is not limited thereto. The anti-overflow groove HO can serve to accommodate the bonding agent of the bonding layer 205 when the bonding agent flows over the bonding layer 205, thereby inhibiting an air gap from being formed between the display panel 100 and the wiring substrate 200. One anti-overflow groove HO can be provided along the bonding layer 205. However, the present disclosure is not limited thereto. A plurality of anti-overflow grooves HO can be provided.

In addition, for example, the display device according to the embodiment of the present disclosure can include the second pad part PP2 disposed on the wiring substrate 200. For example, the second pad part PP2 can be disposed on the upper surface of the wiring substrate 200 that overlaps the first pad part PP1 disposed on the first substrate 110.

The second pad part PP2 can include the plurality of second pads 185 disposed at predetermined intervals in the first direction (X direction) and configured to respectively overlap the plurality of first pads 171 of the first pad part PP1. For example, the plurality of second pads 185 can be divided (or classified) into a plurality of second data pads, a plurality of second pixel driving power pads, and a plurality of second pixel common power pads. Therefore, the second pad part PP2 can include a second data pad part having the plurality of second data pads, a second gate pad part having the plurality of second gate pad, a second pixel driving power pad part having the plurality of second pixel driving power pads, and a second pixel common power pad part having the plurality of second pixel common power pads. Selectively, the second pad part PP2 can further include a second reference power pad part having a plurality of second reference power pads.

For example, the plurality of second gate pads can be divided (or classified) into a second start signal pad, a plurality of second shift clock pads, at least one second gate driving power pad, and at least one second gate common power pad. Therefore, the second gate pad part can include the second start signal pad, the plurality of second shift clock pads, at least one second gate driving power pad, and at least one second gate common power pad. For example, the plurality of second shift clock pads can be divided (or classified) into a plurality of second scan clock pads and a plurality of second carry clock pads. In this case, the plurality of second carry clock pads can be excluded.

In addition, the plurality of routing lines 175 can be disposed to surround the outer surface of the first substrate 110. The routing line 175 according to the embodiment can be disposed on a first outer surface (or one side surface) of the outer surface of the first substrate 110. In this case, the first outer surface can be an outer surface adjacent to the first edge portion (or lower side) of the first substrate 110. The routing line 175 can be disposed to surround the first outer surface of the first substrate 110.

For example, the plurality of routing lines 175 can be respectively connected, in a one-to-one manner (or individually), to the pixel driving lines disposed on the first substrate 110, such that the plurality of routing lines 175 can be connected directly to the pixel driving lines. In another example, the plurality of routing lines 175 can be respectively connected, in a one-to-one manner (or individually), to the pixel driving lines by means of the pads of the first pad part PP1 disposed on the first substrate 110. In this case, the resistance of the pixel driving lines and/or a voltage drop of the signals applied to the pixel driving lines can be reduced by an increase in size implemented by the pads.

The plurality of routing lines 175 according to the embodiment can be divided (or classified) into a plurality of data routing lines, a plurality of gate routing lines, a plurality of pixels driving power routing lines, and a plurality of pixel common power routing lines.

The plurality of data routing lines can connect the plurality of first data pads, which is disposed on the first pad part PP1, and the plurality of second data pads, which is disposed on the second pad part PP2, individually (or in a one-to-one manner).

The plurality of gate routing lines can connect the plurality of first gate pads, which is disposed on the first pad part PP1, and the plurality of second gate pads, which is disposed on the second pad part PP2, individually (or in a one-to-one manner).

The plurality of gate routing lines according to the embodiment can be divided (or classified) into a start signal routing line, a plurality of shift clock routing lines, at least one gate driving power routing line, and at least one gate common power routing line. The plurality of shift clock routing lines according to the embodiment can be divided (or classified) into a plurality of scan clock routing lines and a plurality of carry clock routing lines. In this case, the plurality of carry clock routing lines can be excluded.

In addition, the start signal routing line can electrically connect the first start signal pad, which is disposed on the first pad part PP1, and the second start signal pad disposed on the second pad part PP2.

The plurality of shift clock routing lines can connect the plurality of first shift clock pads, which is disposed on the first pad part PP1, and the plurality of second shift clock pads, which is disposed on the second pad part PP2, individually (or in a one-to-one manner).

Among the plurality of shift clock routing lines according to the embodiment, the plurality of scan clock routing lines can connect the plurality of first scan clock pads, which is disposed on the first pad part PP1, and the plurality of second scan clock pads, which is disposed on the second pad part PP2, individually (or in a one-to-one manner).

Among the plurality of shift clock routing lines according to the embodiment, the plurality of carry clock routing lines can connect the plurality of first carry clock pads, which is disposed on the first pad part PP1, and the plurality of second carry clock pads, which is disposed on the second pad part PP2, individually (or in a one-to-one manner).

In addition, at least one gate driving power routing line can electrically connect at least one first gate driving power pad, which is disposed on the first pad part PP1, and at least one second gate driving power pad disposed on the second pad part PP2.

In addition, at least one gate common power routing line can electrically connect at least one first gate common power pad, which is disposed on the first pad part PP1, and at least one second gate common power pad disposed on the second pad part PP2.

The plurality of pixels driving power routing lines can connect the plurality of first pixel driving power pads, which is disposed on the first pad part PP1, and the plurality of second pixel driving power pads, which is disposed on the second pad part PP2, individually (or in a one-to-one manner).

The plurality of pixel common power routing lines can connect the plurality of first pixel common power pads, which is disposed on the first pad part PP1, and the plurality of second pixel common power pads, which is disposed on the second pad part PP2, individually (or in a one-to-one manner).

The plurality of reference power routing lines can connect the plurality of first reference power pads, which is disposed on the first pad part PP1, and the plurality of second reference power pads, which is disposed on the second pad part PP2, individually (or in a one-to-one manner).

In addition, the display device according to the embodiment can further include a third pad part (or input pad part) PP3, a wiring part WP, and a link line part LLP disposed on the wiring substrate 200.

The third pad part PP3 can be disposed at a lower side of the wiring substrate 200. For example, the third pad part PP3 can be disposed on the first edge portion (lower side) of the upper surface of the wiring substrate 200. For example, the third pad part PP3 can include the plurality of third pads (or input pads) 183 spaced apart from one another at predetermined intervals.

The wiring part WP can be disposed between the second pad part PP2 and the link line part LLP.

For example, the wiring part WP can include the plurality of connection lines 181 configured to connect the second pads 185 of the second pad part PP2 and link lines 182 of the link line part LLP individually (or in a one-to-one manner).

The link line part LLP can be disposed between the wiring part WP and the third pad part PP3.

For example, the link line part LLP can include the plurality of link lines 182 configured to connect the connection lines 181 of the wiring part WP and the third pads 183 of the third pad part PP3 individually (or in a one-to-one manner). For example, the plurality of link lines 182 can have a fan shape spread toward the wiring part WP from the third pad part PP3.

The display device according to the embodiment of the present disclosure can further include a drive circuit part.

The drive circuit part can operate the pixels disposed on the first substrate 110 (or emit light) based on the digital image data and the synchronizing signal supplied from the display driving system, thereby displaying images, which correspond to the image data, in the display area. The drive circuit part can be connected to the third pad part PP3 disposed on the first edge portion of the wiring substrate 200 and output, to the third pad part PP3, data signals, gate control signals, and driving power for operating the pixels disposed on the first substrate 110 (or emitting light). For example, the drive circuit part can be disposed outside the wiring substrate 200, thereby providing the transparent display device in the form of an island without forming a dead zone inside the display device.

For example, in case that the transparent display panel is merely attached onto the wiring substrate, bonding areas of a drive integrated circuit, a printed circuit board, and the like for the operation exist inside the wiring substrate. For this reason, a visually opaque dead zone can occur, the position of the display panel can be fixed, and a constraint on a design can be caused by the dead zone.

Therefore, according to the embodiment of the present disclosure, the wiring substrate 200 and the printed circuit board 190, to which signals are inputted, are separately configured, and the signal is applied to the display panel 100 through the connection line 181 on the wiring substrate 200, such that it is possible to manufacture the transparent display device in the form of an island without forming a dead zone. Therefore, it is possible to provide the effect of suppressing the design constraint caused by a dead zone and reducing manufacturing costs.

In this case, the drive circuit part according to the embodiment can include the flexible film 195, the drive integrated circuit, the printed circuit board 190, and the timing controller.

The flexible film 195 can be connected to the third pad part PP3 disposed on the upper surface of the first edge of the wiring substrate 200. The flexible film 195 according to the embodiment can be a tape carrier package (TCP) or a chip-on film (COF).

For example, one side edge portion (or the output bonding portion) of the flexible film 195 can be attached to the third pad part PP3 disposed on the wiring substrate 200 by the film attaching process using an anisotropic conductive film. For example, the other side edge portion (or the input bonding portion) of the flexible film 195 can be attached to the printed circuit board 190 by the film attaching process using an anisotropic conductive film.

In addition, the drive integrated circuit can be mounted on the flexible film 195. The drive integrated circuit can receive the subpixel data and the data control signal provided from the timing controller, convert the subpixel data into analog data signals in response to the data control signal, and supply the data signals to the corresponding data line. For example, the drive integrated circuit can be a data drive integrated circuit or a source drive integrated circuit. For example, the drive integrated circuit according to the embodiment can generate a plurality of gradation voltages by using a plurality of reference gamma voltages provided from the printed circuit board 190, select a gradation voltage corresponding to the subpixel data among the plurality of gradation voltages, and output the data signal. For example, the data signal can be supplied to the data line via an output channel of the drive integrated circuit, the output bonding portion of the flexible film 195, the third pad part PP3, the link line part LLP, the wiring part WP, the second pad part PP2, the routing line 175, and the first pad part PP1.

In addition, for example, the drive integrated circuit can generate and output pixel driving power and pixel common power required to operate the pixels (or emit light) by using the plurality of reference gamma voltages. In one embodiment, the drive integrated circuit can select a preset reference gamma voltage or a preset gradation voltage as pixel driving power and pixel common power among the plurality of reference gamma voltages or the plurality of gradation voltages and output the reference gamma voltage or the gradation voltage.

Additionally, the drive integrated circuit can additionally generate and output reference power in accordance with the driving operation (or operation) of the pixel circuit disposed in the circuit area of the pixel. For example, the drive integrated circuit can select a preset reference gamma voltage or a preset gradation voltage as reference power among the plurality of reference gamma voltages or the plurality of gradation voltages and output the reference gamma voltage or the gradation voltage.

For example, the pixel driving power, the pixel common power, and the reference power can have different voltage levels. The pixel driving power, the pixel common power, and the reference power can be respectively supplied to the corresponding pixel driving power line, the corresponding pixel common power line, and the corresponding reference power line via the output channel of the drive integrated circuit, the output bonding portion of the flexible film, the third pad part PP3, the link line part LLP, the wiring part WP, the second pad part PP2, the routing line 175, and the first pad part PP1.

For example, the drive integrated circuit can sense a characteristic value of the thin-film driving transistor disposed in the pixel through the plurality of reference power lines disposed on the first substrate 110, generate sensing raw data corresponding to the sensing value, and provide the sensing raw data to the timing controller.

In addition, the printed circuit board 190 can be connected to the edge portion of the other side of the flexible film 195. The printed circuit board 190 serve to transmit signals and power between the components of the drive circuit part.

For example, the timing controller can be mounted on the printed circuit board 190 and receive digital image data and timing synchronizing signals provided from the display driving system through a user connector disposed on the printed circuit board 190. Alternatively, the timing controller can be implemented on the display driving system without being mounted on the printed circuit board 190. Alternatively, the timing controller can be mounted on a separate control board connected between the printed circuit board 190 and the display driving system.

The timing controller can generate pixel data by aligning the digital image data so that the digital image data are suitable for a pixel arrangement structure disposed in the display area based on the timing synchronizing signal, and the timing controller can provide the generated pixel data to the drive integrated circuit.

According to the embodiment, in case that the pixel includes a white subpixel, the timing controller can extract white pixel data based on the digital image data, i.e., red input data, green input data, and blue input data to be supplied to each of the pixels, calculate red pixel data, green pixel data, and blue pixel data by applying offset data, which is based on the extracted white pixel data, to the red input data, the green input data, and the blue input data, align the calculated red pixel data, the calculated green pixel data, the calculated blue pixel data, and the calculated white pixel data so that the calculated red pixel data, the calculated green pixel data, the calculated blue pixel data, and the calculated white pixel data are suitable for the pixel arrangement structure, and supply the calculated red pixel data, the calculated green pixel data, the calculated blue pixel data, and the calculated white pixel data to the drive integrated circuit.

The timing controller can generate the data control signal and the gate control signal based on the timing synchronizing signal, control the operation timing of the drive integrated circuit in response to the data control signal, and control the operation timing of the gate drive circuit in response to the gate control signal. For example, the timing synchronizing signal can include a vertical synchronizing signal, a horizontal synchronizing signal, a data enable signal, and a main clock (or dot clock).

The data control signal according to the embodiment can include a source start pulse, a source shift clock, a source output signal, and the like. The data control signal can be supplied to the drive integrated circuit via the input bonding portion of the flexible film 195 and the flexible film 195.

The gate control signal according to the embodiment can include a start signal (or gate start pulse), a plurality of shift clocks, a forward driving signal, and a reverse driving signal. In this case, the plurality of shift clocks can include a plurality of scan clocks in which phases are sequentially shifted, and a plurality of carry clocks in which phases are sequentially shifted. Additionally, the gate control signal according to the embodiment can further include an external sensing line selecting signal, an external sensing reset signal, and an external sensing control signal for sensing characteristic values of the thin-film driving transistor disposed in the pixel. The gate control signal can be supplied to the gate drive circuit via the input bonding portion of the flexible film 195, the flexible film 195, the output bonding portion of the flexible film 195, the third pad part PP3, the link line part LLP, the wiring part WP, the second pad part PP2, the routing line 175, and the first pad part PP1.

The timing controller can operate the drive integrated circuit and the gate drive circuit in an external sensing mode in a preset external sensing section, generate compensation data for compensating for changes in characteristics of the thin-film driving transistor for each pixel based on the sensing raw data provided from the drive integrated circuit, and modulate the pixel data based on the generated compensation data. For example, the timing controller can operate the drive integrated circuit and the gate drive circuit in the external sensing mode for each external sensing section corresponding to a blanking section (or vertical blanking section) of the vertical synchronizing signal. For example, the external sensing mode can be performed when an inspection process is performed before the product of the display device is shipped, when the display device initially operates, when the power of the display device is turned on (power on), when the power of the display device is turned off (power off), when the power is turned off (power off) after the display device operates over a long period of time, or during a blanking period of a frame preset in real time or periodically.

The timing controller according to the embodiment can store the sensing raw data for each pixel, which are provided from the drive integrated circuit in accordance with the external sensing mode, in a storage circuit. Further, in a display mode, the timing controller can correct the pixel data, which are to be supplied to each of the subpixels, based on the sensing raw data stored in the storage circuit and provide the pixel data to the drive integrated circuit. In this case, the sensing raw data for each pixel can include information on temporal changes of the thin-film driving transistor and the spontaneous light-emitting element disposed in the subpixel. Therefore, in the external sensing mode, the timing controller can sense characteristic values (e.g., threshold voltage or mobility) of the thin-film driving transistor disposed in each of the subpixels and correct the pixel data, which are to be supplied to each of the subpixels, based on the characteristic values. Therefore, it is possible to minimize and suppress the degradation of image quality caused by deviations of the characteristic values of the thin-film driving transistor in the plurality of subpixels.

The drive circuit part according to the embodiment can further include a power circuit part.

The power circuit part can be mounted on the printed circuit board 190, generate various types of power voltages required to display images on the pixels by using input power supplied from the outside, and provide the power voltages to the corresponding circuit. For example, the power circuit part can generate and output a logic power voltage required to operate the timing controller and the drive integrated circuit, the plurality of reference gamma voltages to be provided to the drive integrated circuit, and at least one gate driving power and at least one gate common power required to operate the gate drive circuit. The gate driving power and the gate common power can have different voltage levels.

The plurality of reference gamma voltages can be supplied to the drive integrated circuit via the input bonding portion of the flexible film 195 and the flexible film 195. For example, at least one gate driving power and at least one gate common power can be supplied in common to the gate drive circuit via the input bonding portion of the flexible film 195, the flexible film 195, the output bonding portion of the flexible film 195, the third pad part PP3, the link line part LLP, the wiring part WP, the second pad part PP2, the routing line 175, and the first pad part PP1.

Meanwhile, the structure of the subpixel of the display panel of the display device according to the embodiment of the present disclosure, which is configured as described above, will be described in detail with reference to the drawings.

Figure 9:
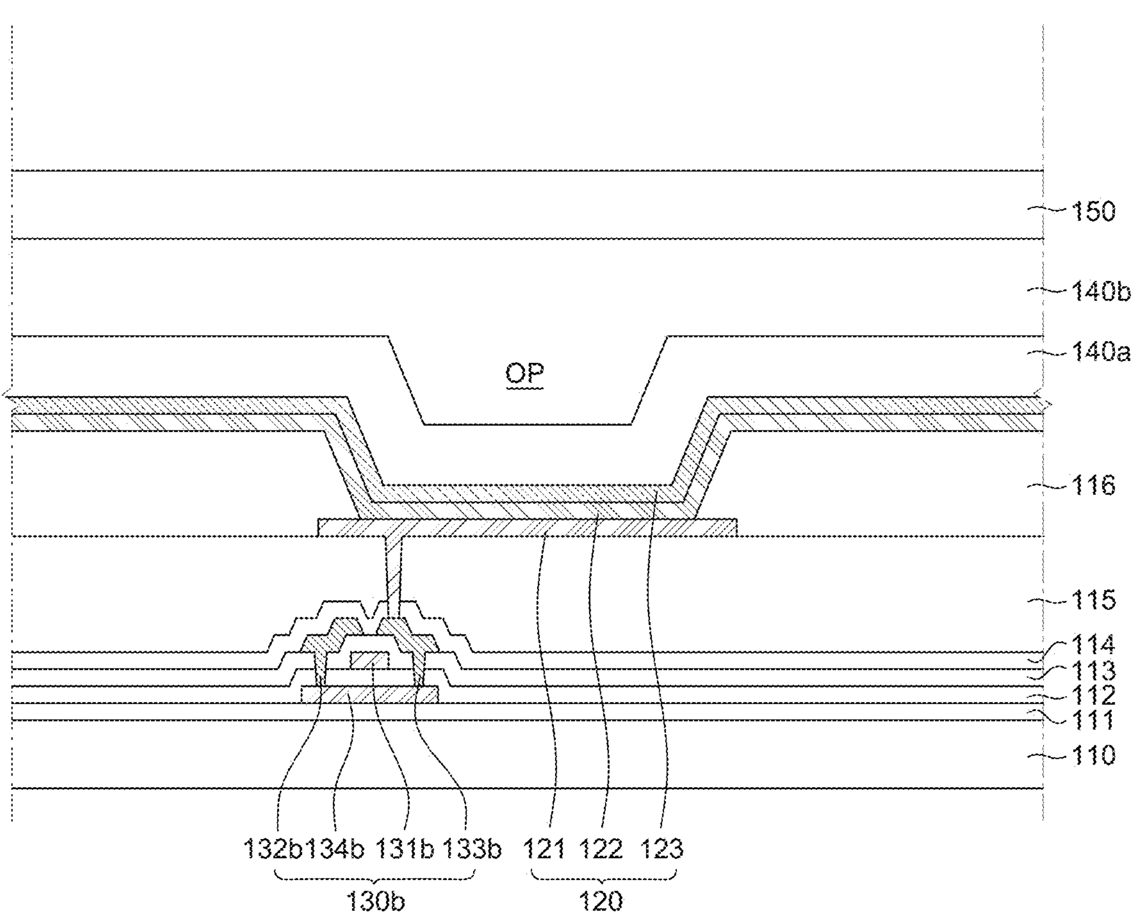
FIG. 9 is a view illustrating a cross-section of the subpixel of a display panel in FIG. 7.

FIG. 9 is a view illustrating a cross-section of the subpixel of the display panel in FIG. 7.

For convenience of description, FIG. 9 illustrates a driving transistor 130*b* (DR in FIG. 2 described above) among the plurality of capacitors and the plurality of transistors of the subpixel.

With reference to FIG. 9, the first substrate 110 can be a support member for supporting other components of the display device and can be made of an insulating material.

For example, the first substrate 110 can be made of glass, resin, or the like. In addition, the first substrate 110 can be made of plastic such as polymer or polyimide (PI) and made of a material having flexibility.

The first substrate 110 can be divided into the display area and the non-display area.

The driving transistor 130*b*, light-emitting elements 120, and a bonding film 140*b* can be disposed in the display area of the first substrate 110. The bonding film 140*b* can constitute an encapsulation layer.

A buffer layer 111 can be disposed above the first substrate 110.

The buffer layer 111 can reduce penetration of moisture or impurities through the first substrate 110. The buffer layer 111 can be configured as a single layer or multilayer made of silicon oxide (SiOx) or silicon nitride (SiNx). However, the present disclosure is not limited thereto. The buffer layer 111 can be excluded in accordance with the type of first substrate 110 or the type of transistor. However, the present disclosure is not limited thereto.

The driving transistor 130*b* can be disposed above the buffer layer 111.

In addition, a switching transistor can be disposed above the buffer layer 111. In addition, the display panel can also have a sensing transistor, a compensating circuit, and the like.

The switching transistor is turned on by a gate pulse supplied through the gate line and transmits data voltage, which is supplied through the data line, to a second gate electrode 131*b* of the driving transistor 130*b*.

The switching transistor can include a first gate electrode, a first source electrode, a first drain electrode, and a first semiconductor layer.

In this case, in response to a signal received from the switching transistor, the driving transistor 130*b* can transmit current, which is transmitted through the power line, to an anode 121. The driving transistor 130*b* can control light emission on the basis of the current transmitted to the anode 121.

The driving transistor 130*b* can include the second gate electrode 131*b*, a second source electrode 132*b*, a second drain electrode 133*b*, and a second semiconductor layer 134*b*.

For example, the first semiconductor layer of the switching transistor and the second semiconductor layer 134*b* of the driving transistor 130*b* can be configured as oxide semiconductors. It is possible to ensure excellent characteristics of the display panel by using an oxide thin-film transistor having high mobility and low leakage current (off-current) properties.

A gate insulation layer 112 can be disposed on the second semiconductor layer 134*b* of the driving transistor 130*b*.

The gate insulation layer 112 can be configured as a single layer or multilayer made of silicon oxide (SiOx) or silicon nitride (SiNx).

The second semiconductor layer 134*b* of the driving transistor 130*b* can include source and drain areas including p-type or n-type impurities and a channel area between the source area and the drain area. The second semiconductor layer 134*b* can further include a low-concentration doping area between the source and drain areas adjacent to the channel area. However, the present disclosure is not limited thereto.

The source and drain areas are areas in which impurities are doped at high concentration. The second source electrode 132*b* and the second drain electrode 133*b* can be respectively connected to the source and drain areas.

The p-type impurities or n-type impurities can be used as impurities ions. The p-type impurity can be one of boron (B), aluminum (Al), gallium (Ga), and indium (In). The n-type impurity can be one of phosphorus (P), arsenic (As), and antimony (Sb).

The channel area can be doped with the n-type impurities or p-type impurities depending on the structures of the thin-film transistors of NMOS or PMOS.

The second gate electrode 131*b* can be disposed on the gate insulation layer 112.

The second gate electrode 131*b* can be configured as a single layer or multilayer made of a conductive metallic material such as copper (Cu), aluminum (Al), chromium (Cr), molybdenum (Mo), gold (Au), titanium (Ti), nickel (Ni), neodymium (Nd), or an alloy thereof. However, the present disclosure is not limited thereto.

An interlayer insulation layer 113 can be disposed between the second gate electrode 131*b*, the second source electrode 132*b*, and the second drain electrode 133*b*.

The interlayer insulation layer 113 can be configured as a single layer or multilayer made of silicon oxide (SiOx) or silicon nitride (SiNx).

The second source electrode 132*b* and the second drain electrode 133*b* can be disposed on the interlayer insulation layer 113.

For example, the second source electrode 132*b* and the second drain electrode 133*b* can each be configured as a single layer or multilayer made of a conductive metallic material such as aluminum (Al), molybdenum (Mo), chromium (Cr), gold (Au), titanium (Ti), nickel (Ni), neodymium (Nd), copper (Cu), or an alloy thereof. However, the present disclosure is not limited thereto.

A protective layer 114 can be disposed on the driving transistor 130*b*. The protective layer 114 can be configured as an inorganic insulating layer made of silicon oxide (SiOx) and silicon nitride (SiNx). The protective layer 114 can serve to suppress unnecessary electrical connection between the components disposed above and below the protective layer 114. The protective layer 114 can also serve to inhibit damage or contamination from the outside. The protective layer 114 can be excluded in accordance with the configurations and properties of the driving transistor 130*b* and the light-emitting element 120.

A planarization layer 115 can be disposed on the protective layer 114. The planarization layer 115 is an insulation layer for planarizing an upper portion of the first substrate 110.

The planarization layer 115 can be made of an organic material. For example, the planarization layer 115 can be configured as a single layer or multilayer made of polyimide or photo acrylic. However, the present disclosure is not limited thereto.

For example, the planarization layer 115 can be configured as a multilayer. A first planarization layer can be disposed on the protective layer 114, and a second planarization layer can be disposed on the first planarization layer. An intermediate electrode can be connected to the driving transistor 130*b* through a contact hole formed in the first planarization layer. However, the present disclosure is not limited thereto. As illustrated in FIG. 9, in case that the planarization layer 115 is configured as a single layer, the anode 121 can be connected directly to the driving transistor 130*b*.

The plurality of light-emitting elements 120 can be provided on the planarization layer 115 and disposed on the plurality of subpixels. The light-emitting element 120 can include the anode 121, an organic layer 122, and a cathode 123. Meanwhile, the organic layer 122 can include an individual layer disposed in the light-emitting area, and a common layer disposed on the entire surface of the first substrate 110 including the light-emitting area. However, the present disclosure is not limited thereto.

The anode 121 can be disposed on the planarization layer 115. The anode 121 can be electrically connected to the driving transistor 130*b* and receive the drive current of the pixel circuit. Because the anode 121 supplies positive holes to the light-emitting layer, the anode 121 can be made of an electrically conductive material having a high work function. The anode 121 can be made of a transparent electrically conductive material such as indium tin oxide (ITO) or indium zinc oxide (IZO). However, the present disclosure is not limited thereto.

The display device can be implemented as a top emission type or a bottom emission type. In the case of the top emission type, a reflective layer, which is made of a metallic material, for example, a material such as aluminum (Al) or silver (Ag) that has excellent reflection efficiency, can be additionally provided at a lower side of the anode 121 so that the light emitted from the light-emitting layer is reflected by the anode 121 and then propagates upward, i.e., toward the cathode 123. On the contrary, in case that the display device is the bottom emission type, the anode 121 can be made of only a transparent electrically conductive material. Hereinafter, the description will be made on the assumption that the display device according to the embodiment of the present disclosure is the top emission type.

As described above, the light-emitting element 120 of the present disclosure can include the anode 121, the organic layer 122, and the cathode 123.

The organic layer 122 can be disposed between the anode 121 and the cathode 123. The organic layer 122 is an area in which the light is emitted as electrons and positive holes supplied from the anode 121 and the cathode 123 are combined.

A bank 116 can be disposed on the anode 121 and the planarization layer 115. The bank 116 is an insulation layer disposed between the plurality of subpixels in order to divide the plurality of subpixels.

The bank 116 can include an opening portion OP that exposes a part of the anode 121. The bank 116 can be made of an organic insulating material disposed to cover an edge or an edge portion of the anode 121. For example, the bank 116 can be made of polyimide, acryl, or benzocyclobutene (BCB)-based resin. However, the present disclosure is not limited thereto.

At least one spacer can be disposed on the bank 116. The organic layer 122 can be disposed on the anode 121 and the bank 116. The cathode 123 can be disposed on the organic layer 122.

Because the cathode 123 supplies electrons to the organic layer 122, the cathode 123 can be made of an electrically conductive material having a low work function, for example. The cathode 123 can be configured as a single layer over the plurality of subpixels. The cathode 123 can be made of an electrically transparent conductive material such as indium tin oxide (ITO) or indium zinc oxide (IZO) or made of an alloy of ytterbium (Yb). The cathode 123 can further include a metal doping layer. However, the present disclosure is not limited thereto. For example, the cathode 123 can be electrically connected to the low-potential power line and supplied with the low-potential power signal.

A capping layer can be disposed on the upper portion of the first substrate 110 on which the cathode 123 is disposed. The capping layer can be made of an organic material such as polymer.

In the case of the top emission type, the capping layer can have a particular refractive index and serve to collect light to improve emission of light. In the case of the bottom emission type, the capping layer can serve as a buffer for the cathode 123 of the light-emitting element 120.

A protective layer 140*a* can be disposed on the capping layer.

The elements, such as the light-emitting elements 120, which use organic materials, are very vulnerable to gas in the atmosphere, particularly moisture or oxygen and have low durability against heat. Therefore, a thorough encapsulation process is required.

Generally, the encapsulation processes are broadly classified into two types of encapsulation processes.

One encapsulation process is a covering process of attaching a moisture absorbent (getter) into a cover made of glass or metal and attaching the cover to an element by using a bonding agent having water permeability. The other encapsulation process is a thin-film encapsulation process of stacking various types of layers and attaching the stack to the light-emitting element or depositing a film directly on the light-emitting element.

The bonding film 140*b* and the second substrate 150 can be sequentially disposed on the protective layer 140*a*. However, the display device according to the embodiment of the present disclosure is not limited to the above-mentioned layered structure.

The bonding film 140*b* can be disposed to surround the protective layer 140*a*.

The bonding film 140*b*, together with the protective layer 140*a* and the second substrate 150, can protect the light-emitting element 120 of the pixel part from external moisture, oxygen, and impact. The bonding film 140*b* can further include a moisture absorbent. The moisture absorbent can include particles having hygroscopicity. The moisture absorbent can absorb moisture, oxygen, and the like from the outside, thereby minimizing or reducing a degree to which moisture and oxygen penetrate into the pixel part. However, the present disclosure is not limited thereto.

The bonding film 140*b* can include a filler. The filler can be made of a transparent material so that brightness does not deteriorate while light emitted from the light-emitting element 120 passes through the second substrate 150. For example, the filler can be made of epoxy or olefin and include talc, calcium oxide (CaO), barium oxide (BaO), zeolite (zeolite), silicon oxide (SiO), and the like.

The second substrate 150 can be disposed on the bonding film 140*b*. The second substrate 150, together with the bonding film 140*b*, can protect the light-emitting element 120 of the pixel part. The second substrate 150 can protect the light-emitting element 120 from outside moisture, oxygen, impact, and the like.

A dam can be provided at the edge of the first substrate 110 and disposed between the first substrate 110 and the second substrate 150. The dam can reinforce a bonding force between the first substrate 110 and the second substrate 150 and block moisture.

Hereinafter, a transparent pixel structure for implementing the transparent display panel and the transparent display device according to one or more aspects of the present disclosure will be described in detail with reference to the drawings.

Figure 10:
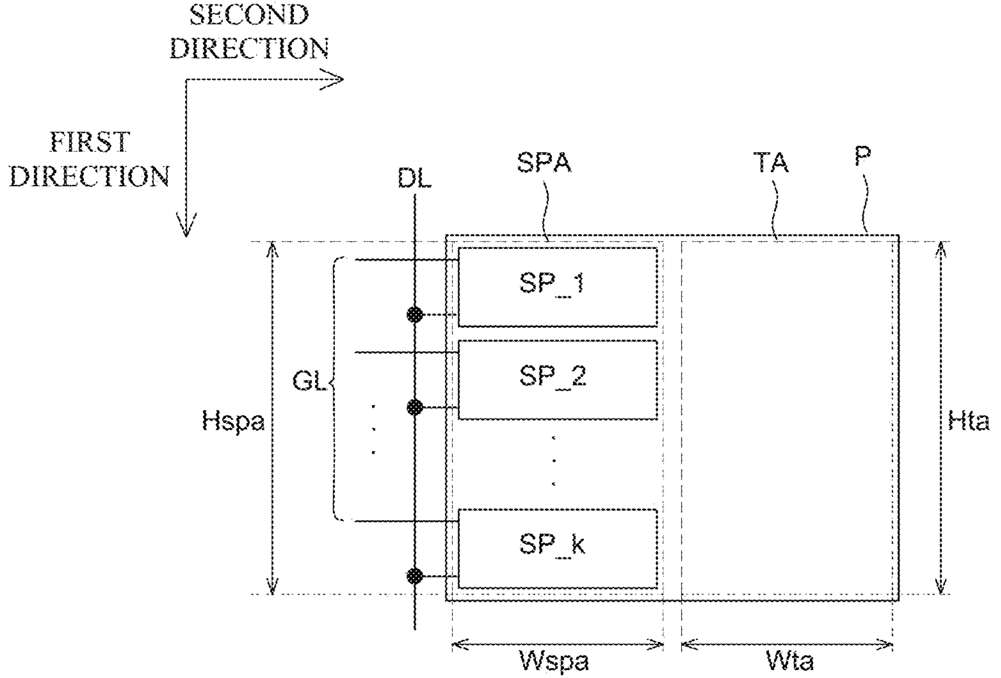
FIGS. 10 and 11 are views illustrating a pixel structure as an example of the present disclosure.
Figure 11:
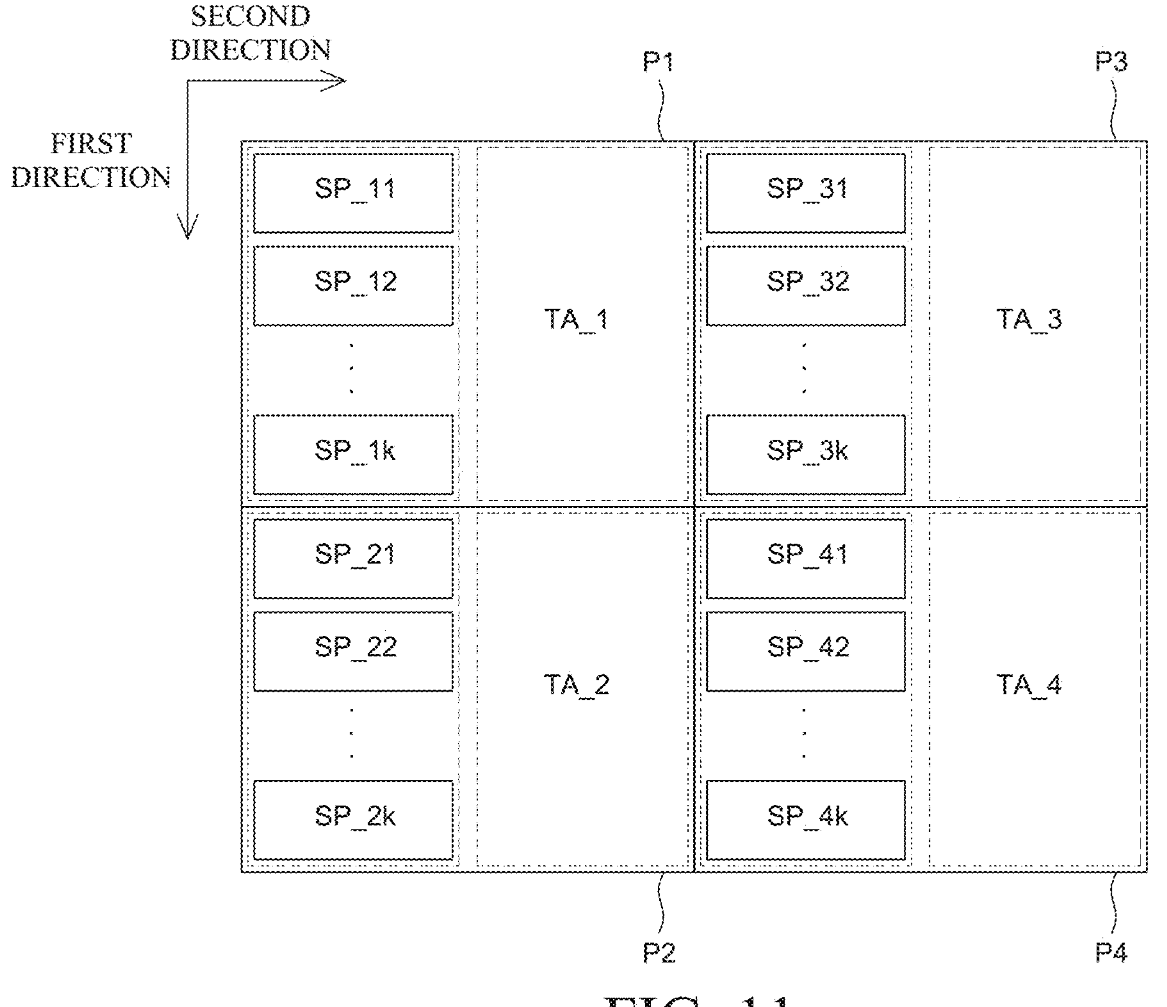

FIGS. 10 and 11 are views illustrating the pixel structure as an example of the present disclosure.

Particularly, FIGS. 10 and 11 illustrate an example of the transparent pixel structure of the transparent display device according to the embodiment. In addition, FIG. 10 illustrates a transparent pixel structure of a single transparent pixel, and FIG. 11 illustrates four transparent pixels as an example.

With reference to FIG. 10, the single transparent pixel can include a subpixel area SPA having k subpixels (SP_1, SP_2, . . . , SP_k) configured to express different colors, and a transparent area TA.

In this case, k, which means the number of subpixels included in the single transparent pixel, can be 3 or 4. In some instances, k can be a natural number of 2 or 5 or more.

In the single transparent pixel, the subpixels (SP_1, SP_2, . . . , SP_k) can be disposed adjacent to one another in the first direction.

The transparent area TA can be disposed adjacent to the subpixel area SPA in the second direction. For example, the transparent area TA can be disposed adjacent to the subpixels (SP_1, SP_2, . . . , SP_k) in the second direction.

As described above, because the transparent pixels each include the transparent area TA, the transparent pixel has the transparent structure. The transparent display panel and the transparent display device according to the embodiment can be implemented by the transparent pixel structure.

For example, in each of the transparent pixels, a height Hta of the transparent area TA can correspond or be similar to a height Hspa of the subpixel area SPA, and a width Wta of the transparent area TA can be equal to or smaller or larger than a width Wspa of the subpixel area SPA. In this case, a ratio (Ata/Aspa) between a size (Ata=Wta×Hta) of the transparent area TA and a size (Aspa=Wspa×Hspa) of the subpixel area SPA, which are determined by widths W and heights H, can be determined depending on at least one of a transmittance rate, resolution, and the like of the transparent display device.

In this case, as a size Ata of the transparent area TA becomes larger than a size Aspa of the subpixel area SPA, i.e., the ratio (Ata/Aspa) between the size (Ata=Wta×Hta) of the transparent area TA and the size (Aspa=Wspa×Hspa) of the subpixel area SPA increases, the transparency of the transparent pixel can increase, and the transparency of the transparent display device can also increase.

FIG. 11 is a view illustrating four transparent pixels P1, P2, P3, and P4 having the transparent pixel structures in FIG. 10. A first transparent pixel P1 and a second transparent pixel P2 can be disposed adjacent to each other in the first direction, a third transparent pixel P3 and a fourth transparent pixel P4 can also be disposed adjacent to each other in the first direction, the first transparent pixel P1 and the third transparent pixel P3 can be disposed adjacent to each other in the second direction, and the second transparent pixel P2 and the fourth transparent pixel P4 can also be disposed adjacent to each other in the second direction.

With reference to FIG. 11, the first transparent pixel P1 can include k first subpixels (SP_11, SP_12, . . . , SP_1*k*) formed in the subpixel area SPA and disposed adjacent to one another in the first direction, and a first transparent area TA_1 disposed adjacent to the subpixel area SPA in the second direction.

The second transparent pixel P2 can include k second subpixels (SP_21, SP_22, . . . , SP_2*k*) formed in the subpixel area SPA and disposed adjacent to one another in the first direction, and a second transparent area TA_2 disposed adjacent to the subpixel area SPA in the second direction.

The third transparent pixel P3 can include k third subpixels (SP_31, SP_32, . . . , SP_3*k*) formed in the subpixel area SPA and disposed adjacent to one another in the first direction, and a third transparent area TA_3 disposed adjacent to the subpixel area SPA in the second direction.

The fourth transparent pixel P4 can include k fourth subpixels (SP_41, SP_42, . . . , SP_4*k*) formed in the subpixel area SPA and disposed adjacent to one another in the first direction, and a fourth transparent area TA_4 disposed adjacent to the subpixel area SPA in the second direction.

The transparent areas TA_1 and TA_2 of the first and second transparent pixels P1 and P2 adjacent to each other in the first direction can be disposed adjacent to each other. In addition, the transparent areas TA_3 and TA_4 of the third and fourth transparent pixels P3 and P4 disposed adjacent to each other in the first direction can be disposed adjacent to each other.

Meanwhile, in another embodiment of the present disclosure, a plurality of column spacers can be disposed in the bonding layer to maintain a predetermined gap between the display panel and the wiring substrate. The plurality of column spacers will be described in detail with reference to the drawings.

Figure 12:
FIG. 12 is a top plan view illustrating a wiring substrate of a display device according to another embodiment of the present disclosure.
Figure 12:
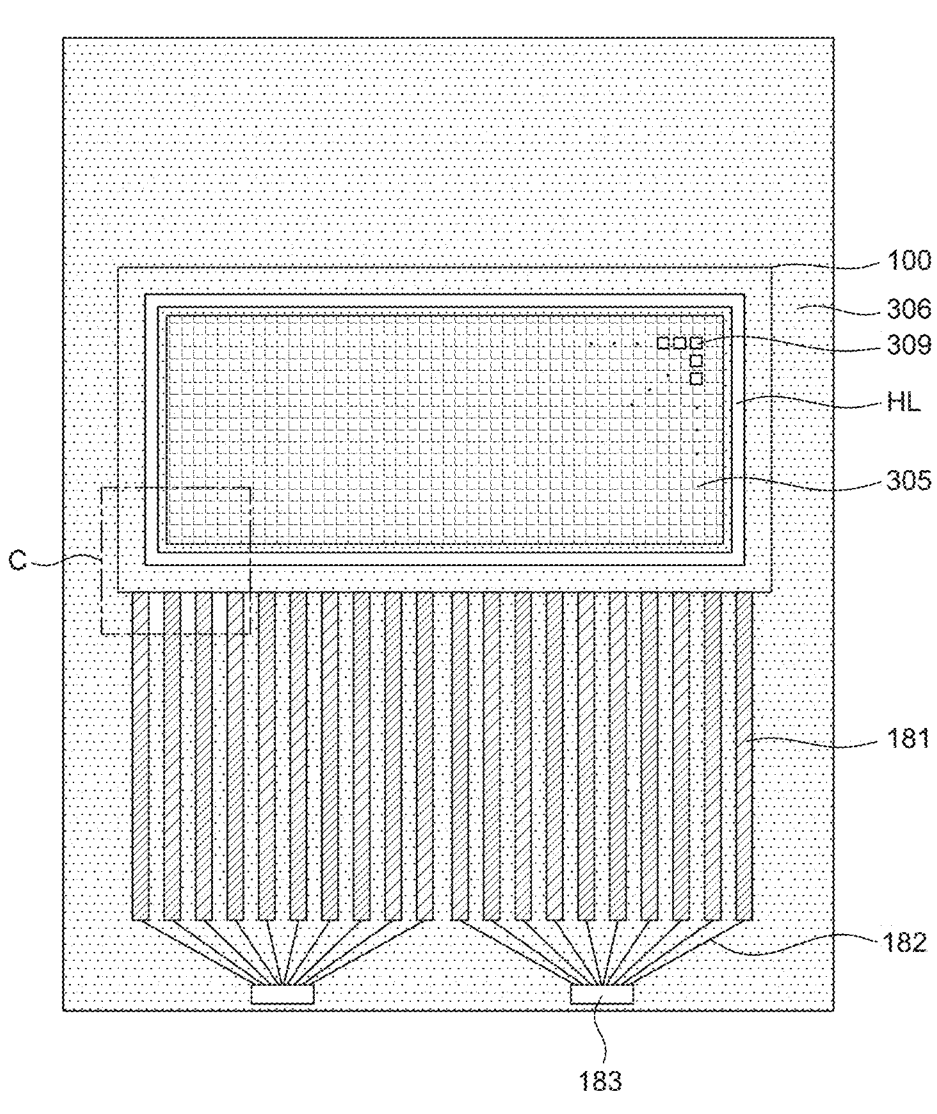

FIG. 12 is a top plan view illustrating a wiring substrate of a display device according to another embodiment of the present disclosure.

Figure 13:
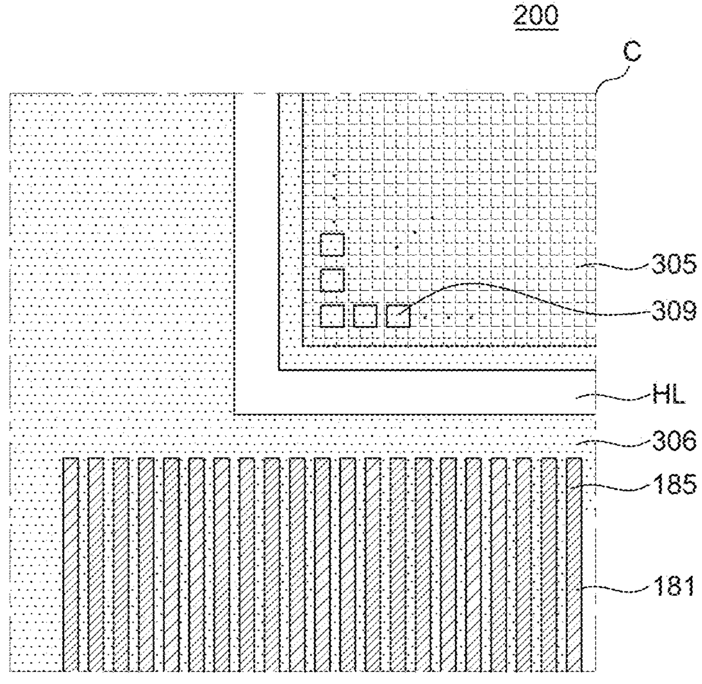
FIG. 13 is an enlarged view of part C in FIG. 12.

FIG. 13 is an enlarged view of part C in FIG. 12.

Figure 14:
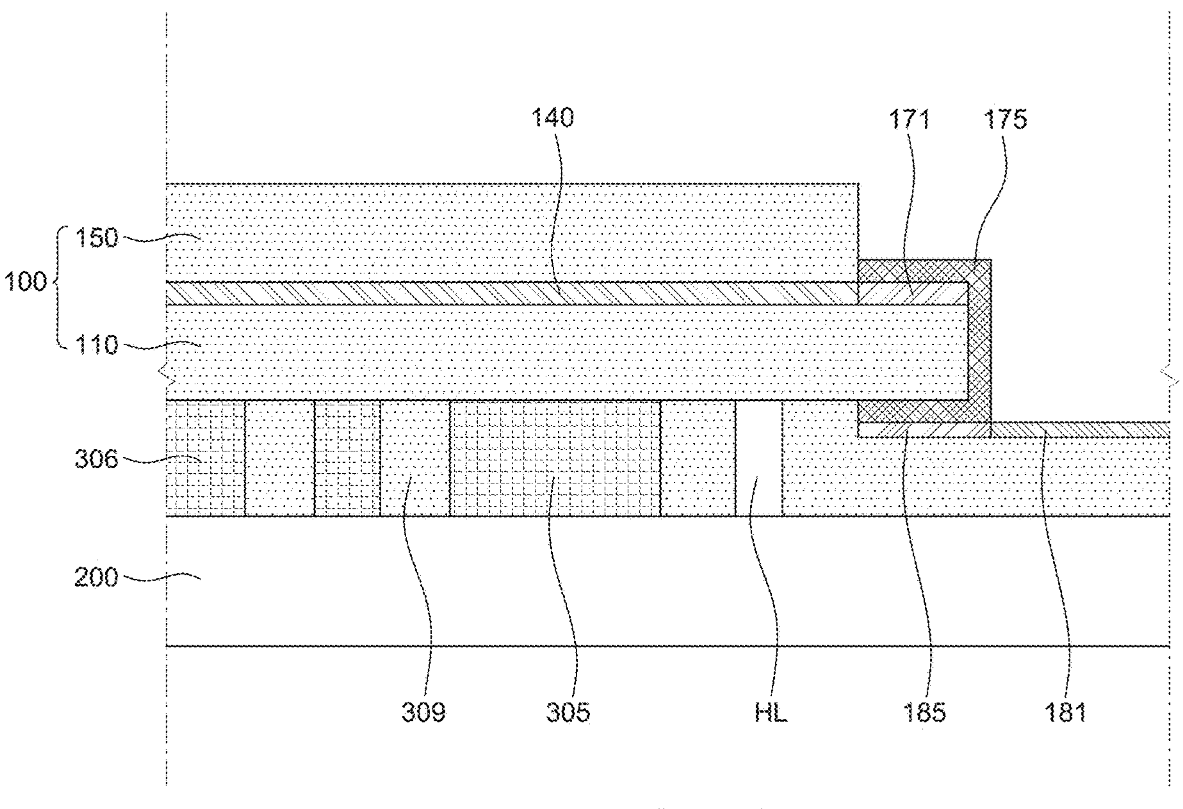
FIG. 14 is a view illustrating a part of a cross-section of a display device according to another embodiment of the present disclosure.

FIG. 14 is a view illustrating a part of a cross-section of a display device according to another embodiment of the present disclosure.

The display device of another embodiment of the present disclosure in FIGS. 12 to 14 has substantially the same configuration as the display device of the above-mentioned embodiment in FIGS. 3 to 8, except that a plurality of column spacers 309 are disposed in a bonding layer 305. Therefore, the same reference numerals are assigned to the same components, and a description thereof will be omitted or may be briefly provided.

Particularly, FIG. 12 illustrates the wiring substrate 200 to which the display panel 100 is attached.

With reference to FIGS. 12 to 14, the display device according to the embodiment of the present disclosure can include the display panel 100 and the wiring substrate 200 disposed on the rear surface of the display panel 100.

Meanwhile, the display panel 100 can include the first substrate 110, the second substrate 150, the element part 140, and the routing line 175.

The second substrate 150 can be coupled (or attached) to the first surface of the first substrate 110 by means of the element part 140.

The wiring substrate 200 can be disposed on the rear surface of the display panel 100 by means of bonding members 305, 306, and 309.

The bonding members 305, 306, and 309 can be interposed between the display panel 100 and the wiring substrate 200.

For example, the bonding members 305, 306, and 309 can include a bonding layer 305 disposed between the display panel 100 and the wiring substrate 200 and configured to attach or bond the display panel 100 and the wiring substrate 200 to each other. As described above, the second surface (or rear surface) of the first substrate 110 of the display panel 100 can be coupled to one surface of the bonding layer 305, and the upper surface of the wiring substrate 200 can be coupled to the other surface of the bonding layer 305. Therefore, the display panel 100 and the wiring substrate 200, which are attached (or coupled) to each other by the bonding layer 305, can constitute the transparent display device in the form of an island.

In addition, for example, the bonding layer 305 can be disposed inside the rear surface of the display panel 100. For example, the bonding layer 305 can be disposed at the entire inner side of the display panel 100, except for the edge of the rear surface of the display panel 100 at which an anti-overflow hole HL is formed. The bonding layer 305 can be made of an optically transparent bonding agent, for example, optically clear resin (OCR). However, the present disclosure is not limited thereto.

The bonding members 305, 306, and 309 can include a support layer 306 and the column spacers 309 disposed between the display panel 100 and the wiring substrate 200 and configured to maintain a predetermined gap between the display panel 100 and the wiring substrate 200. For example, the support layer 306 can be disposed outside the bonding layer 305, and the plurality of column spacers 309 can be dispersed and disposed in the bonding layer 305. For example, the support layer 306 and the plurality of column spacers 309 can each be configured as an organic insulation layer made of photo-acryl (PAC). However, the present disclosure is not limited thereto. For example, the support layers 306 can be disposed on the entire surface of the wiring substrate 200 outside the bonding layer 305. As described above, in another embodiment of the present disclosure, the bonding members 305, 306, and 309 including the transparent support layer 306, the bonding layer 305, and the column spacers 309 can be provided between the display panel 100 and the wiring substrate 200 to maintain the gap without an air gap between the display panel 100 and the wiring substrate 200, thereby avoiding or suppressing a limitation with visibility by suppressing a stain defect which can be caused by an air gap.

Meanwhile, in another embodiment of the present disclosure, the anti-overflow hole HL can be provided along the support layer 206 at the edge of the support layer 206 outside the bonding layer 305. However, the present disclosure is not limited thereto. The anti-overflow hole HL can serve to accommodate the bonding agent of the bonding layer 305 when the bonding agent flows over the bonding layer 305, thereby inhibiting an air gap from being formed between the display panel 100 and the wiring substrate 200. In this case, one anti-overflow hole HL can be provided along the edge of the support layer 206. However, the present disclosure is not limited thereto. A plurality of anti-overflow holes HL can be provided. In addition, for example, the anti-overflow hole HL can have a rectangular rim shape along the edge of the support layer 206. However, the present disclosure is not limited thereto.

The exemplary embodiments of the present disclosure can also be described as follows:

According to an aspect of the present disclosure, there is provided a display device. The display device includes a display panel having a plurality of pixels, a plurality of routing lines disposed on an outer surface at one side of the display panel, a wiring substrate disposed on a lower surface of the display panel and having a plurality of connection lines respectively connected to the plurality of routing lines and a support layer disposed between the display panel and the wiring substrate and extending toward a lower side of the plurality of connection lines.

The display device can further comprise a bonding layer disposed between the display panel and the wiring substrate and configured to attach the display panel and the wiring substrate.

The display panel can comprise a first substrate, a second substrate opposite to the first substrate and an element layer between the first substrate and the second substrate.

The second substrate can have a smaller size than the first substrate, one side of the first substrate can be exposed, and a first pad part can be disposed at one side of the exposed first substrate.

The display device can further comprise a second pad part disposed on an upper surface of the wiring substrate so as to overlap the first pad part, the second pad part can comprise a plurality of second pads disposed in one direction and configured to overlap a plurality of first pads of the first pad part.

A thickness of the support layer below the connection line can be smaller than a thickness of the support layer below the display panel.

The routing line can be disposed to surround an outer surface at one side of the first substrate, and the plurality of routing lines can be respectively connected to pixel driving lines in a one-to-one manner through the first pads disposed on the first substrate.

The plurality of routing lines can connect the plurality of first pads, which can be disposed on the first pad part, and the plurality of second pads, which can be disposed on the second pad part, in a one-to-one manner.

The display device can further comprise a third pad part disposed on an upper surface at the one side of the wiring substrate, the third pad part can comprise a plurality of third pads disposed in one direction.

The plurality of connection lines can connect the plurality of second pads and the plurality of third pads in a one-to-one manner.

The display device can further comprise a plurality of link lines disposed between the second pad part and the third pad part and configured to connect the plurality of connection lines and the plurality of third pads in a one-to-one manner, the plurality of link lines can have a fan shape spread toward the connection line from the third pad part.

The display device can further comprise a printed circuit board disposed at one side of the wiring substrate and a flexible film having one side edge portion attached to the third pad part, and the other side edge portion attached to the printed circuit board.

The element layer can comprise a TFT element layer, a light-emitting element layer, and an encapsulation layer.

The bonding layer can have a rim shape inside an edge of the display panel, and a chamfer can be provided in an edge area of the bonding layer.

The bonding layer and the support layer can be transparent.

The support layer can be disposed on an entire surface of the wiring substrate inside the bonding layer and outside the bonding layer.

The display device can further comprise an anti-overflow groove provided along the bonding layer on an upper surface of the support layer adjacent to the bonding layer.

The bonding layer can be disposed inside a rear surface of the display panel.

The support layer can be disposed outside the bonding layer, and the display device can further comprise a plurality of column spacers configured as the support layer and dispersed and disposed in the bonding layer.

The display device can further comprise an anti-overflow hole provided along the support layer at an edge of the support layer outside the bonding layer, the bonding layer can be disposed at an entire inner side of the display panel, except for an edge of a rear surface of the display panel at which the anti-overflow hole is formed.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:

a display panel having a plurality of pixels;

a plurality of routing lines disposed on an outer surface at one side of the display panel;

a wiring substrate disposed on a lower surface of the display panel and having a plurality of connection lines respectively connected to the plurality of routing lines; and a support layer disposed between the display panel and the wiring substrate, and extending toward a lower side of the plurality of connection lines;

a bonding layer disposed between the display panel and the wiring substrate and the support layer is disposed inside and outside of the bonding layer;

wherein the display panel comprises a first substrate, a second substrate and an element layer comprising a light-emitting-layer disposed between the first substrate and the second substrate; and wherein one side of the first substrate is exposed, a first pad part is disposed at the one side of the exposed first substrate and a second pad part is disposed on an upper surface of the wiring substrate so as to overlap the first pad part.

2. The display device of claim 1, wherein:

the bonding layer is configured to bond the display panel and the wiring substrate to each other.

3. The display device of claim 2, wherein the display panel comprises:

the second substrate disposed opposite to the first substrate.

4. The display device of claim 3, wherein the second substrate has a smaller size than the first substrate.

5. The display device of claim 4, wherein the second pad part comprises a plurality of second pads disposed in one direction and configured to overlap a plurality of first pads of the first pad part.

6. The display device of claim 5, wherein a thickness of the support layer below at least one of the plurality of connection lines is smaller than a thickness of the support layer below the display panel.

7. The display device of claim 5, wherein at least one of the plurality of routing lines is disposed to surround an outer surface at one side of the first substrate, and wherein the plurality of routing lines are respectively connected to pixel driving lines in a one-to-one manner through the plurality of first pads disposed on the first substrate.

8. The display device of claim 5, wherein the plurality of routing lines connect the plurality of first pads being disposed on the first pad part, and the plurality of second pads being disposed on the second pad part, in a one-to-one manner.

9. The display device of claim 5, further comprising:

a third pad part disposed on an upper surface at the one side of the wiring substrate, wherein the third pad part comprises a plurality of third pads disposed in one direction.

10. The display device of claim 9, wherein the plurality of connection lines connect the plurality of second pads and the plurality of third pads in a one-to-one manner.

11. The display device of claim 9, further comprising:

a plurality of link lines disposed between the second pad part and the third pad part, and configured to connect the plurality of connection lines and the plurality of third pads in a one-to-one manner, wherein the plurality of link lines have a fan shape spread toward one of the plurality of connection lines from the third pad part.

12. The display device of claim 9, further comprising:

a printed circuit board disposed at one side of the wiring substrate; and a flexible film having one side edge portion attached to the third pad part, and another side edge portion attached to the printed circuit board.

13. The display device of claim 2, wherein the bonding layer has a rim shape inside an edge of the display panel, and a chamfer is provided in an edge area of the bonding layer.

14. The display device of claim 3, wherein the element layer further comprises a thin film transistor (TFT) element layer and an encapsulation layer.

15. The display device of claim 14, wherein the bonding layer and the support layer are transparent.

16. The display device of claim 14, wherein the support layer is disposed on an entire surface of the wiring substrate inside the bonding layer and outside the bonding layer.

17. The display device of claim 14, further comprising:

an anti-overflow groove disposed along the bonding layer on an upper surface of the support layer adjacent to the bonding layer.

18. The display device of claim 14, wherein the bonding layer is disposed inside a rear surface of the display panel.

19. The display device of claim 14, wherein the support layer is disposed outside the bonding layer, and the display device further comprises a plurality of column spacers configured as the support layer, and dispersed and disposed in the bonding layer.

20. The display device of claim 14, further comprising:

an anti-overflow hole disposed along the support layer at an edge of the support layer outside the bonding layer, wherein the bonding layer is disposed at an entire inner side of the display panel, except for an edge of a rear surface of the display panel at which the anti-overflow hole is disposed.

* * * * *